United States Patent
Hansen et al.

(10) Patent No.: US 10,002,760 B2
(45) Date of Patent: *Jun. 19, 2018

(54) METHOD FOR MANUFACTURING SIC WAFER FIT FOR INTEGRATION WITH POWER DEVICE MANUFACTURING TECHNOLOGY

(71) Applicant: Dow Corning Corporation, Midland, MI (US)

(72) Inventors: Darren Hansen, Midland, MI (US); Mark Loboda, Bay City, MI (US); Ian Manning, Midland, MI (US); Kevin Moeggenborg, Midland, MI (US); Stephan Mueller, Midland, MI (US); Christopher Parfeniuk, Midland, MI (US); Jeffrey Quast, Bay City, MI (US); Victor Torres, Midland, MI (US); Clinton Whiteley, Midland, MI (US)

(73) Assignee: DOW SILICONES CORPORATION, Midland, MI (US)

( * ) Notice: Subject to any disclaimer, the term of this patent is extended or adjusted under 35 U.S.C. 154(b) by 146 days.

This patent is subject to a terminal disclaimer.

(21) Appl. No.: 15/061,959

(22) Filed: Mar. 4, 2016

(65) Prior Publication Data

US 2016/0189956 A1  Jun. 30, 2016

Related U.S. Application Data

(62) Division of application No. 14/585,101, filed on Dec. 29, 2014, now Pat. No. 9,279,192.

(Continued)

(51) Int. Cl.
*C30B 23/02* (2006.01)
*H01L 21/02* (2006.01)
(Continued)

(52) U.S. Cl.
CPC ...... *H01L 21/02529* (2013.01); *C30B 23/025* (2013.01); *C30B 25/08* (2013.01);
(Continued)

(58) Field of Classification Search
CPC ....... C30B 23/00; C30B 23/02; C30B 23/025; C30B 23/06; C30B 23/063; C30B 25/00;
(Continued)

(56) References Cited

U.S. PATENT DOCUMENTS 2,854,364 A  9/1958 Lely
3,691,694 A  9/1972 Goetz et al.
(Continued)

FOREIGN PATENT DOCUMENTS

CN  1643188 A  7/2005
CN  101072901 A  11/2007
(Continued)

OTHER PUBLICATIONS

Decision of Patent Grant for Korean Patent Application No. 10-2015-7008990 dated Mar. 17, 2016.
(Continued)

*Primary Examiner* — Kenneth A Bratland, Jr.
(74) *Attorney, Agent, or Firm* — Womble Bond Dickinson (US) LLP; Joseph Bach, Esq.

(57) ABSTRACT

A method for producing silicon carbide substrates fit for epitaxial growth in a standard epitaxial chamber normally used for silicon wafers processing. Strict limitations are placed on any substrate that is to be processed in a chamber normally used for silicon substrates, so as to avoid contamination of the silicon wafers. To take full advantage of standard silicon processing equipment, the SiC substrates are of diameter of at least 150 mm. For proper growth of the SiC boule, the growth crucible is made to have interior volume that is six to twelve times the final growth volume (Continued)

of the boule. Also, the interior volume of the crucible is made to have height to width ratio of 0.8 to 4.0. Strict limits are placed on contamination, particles, and defects in each substrate.

24 Claims, 2 Drawing Sheets

Related U.S. Application Data

(60) Provisional application No. 62/030,490, filed on Jul. 29, 2014.

(51) Int. Cl.
| | | |
|---|---|---|
| C30B 29/36 | (2006.01) | |
| C30B 25/08 | (2006.01) | |
| C30B 25/16 | (2006.01) | |
| C30B 25/20 | (2006.01) | |
| C30B 33/10 | (2006.01) | |

(52) U.S. Cl.
CPC ............ *C30B 25/165* (2013.01); *C30B 25/20* (2013.01); *C30B 29/36* (2013.01); *C30B 33/10* (2013.01); *H01L 21/02008* (2013.01); *H01L 21/02052* (2013.01)

(58) Field of Classification Search
CPC ....... C30B 25/02; C30B 25/08; C30B 25/165; C30B 25/20; C30B 29/00; C30B 29/10; C30B 29/36; C30B 33/10; H01L 21/02008; H01L 21/02052; H01L 21/02529
USPC .......... 117/84, 88–89, 93–94, 102, 105–106, 117/902, 911, 937, 951
See application file for complete search history.

(56) References Cited

U.S. PATENT DOCUMENTS

| | | | |
|---|---|---|---|
| 4,582,561 | A | 4/1986 | Ioku et al. |
| 4,855,254 | A | 8/1989 | Eshita et al. |
| 4,866,005 | A | 9/1989 | Davis et al. |
| 4,912,063 | A | 3/1990 | Davis et al. |
| 4,912,064 | A | 3/1990 | Kong et al. |
| 5,192,987 | A | 3/1993 | Khan et al. |
| 5,248,385 | A | 9/1993 | Powell |
| 5,416,465 | A | 5/1995 | Lin |
| 5,679,153 | A | 10/1997 | Dmitriev et al. |
| 5,709,745 | A | 1/1998 | Larkin et al. |
| 5,751,055 | A | 5/1998 | Maruyama et al. |
| 5,888,887 | A | 3/1999 | Li et al. |
| 5,895,583 | A | 4/1999 | Augustine et al. |
| 5,899,743 | A | 5/1999 | Kai et al. |
| 5,942,445 | A | 8/1999 | Kato et al. |
| 5,944,890 | A | 8/1999 | Kitou et al. |
| 5,954,881 | A | 9/1999 | Burk, Jr. et al. |
| 6,196,901 | B1 | 3/2001 | Minami |
| 6,214,108 | B1 | 4/2001 | Okamoto et al. |
| 6,261,931 | B1 | 7/2001 | Keller et al. |
| 6,336,971 | B1 | 1/2002 | Nagato et al. |
| 6,352,927 | B2 | 3/2002 | Kishimoto |
| 6,406,539 | B1 | 6/2002 | Shigeto et al. |
| 6,491,836 | B1 | 12/2002 | Kato et al. |
| 6,534,026 | B2 | 3/2003 | Vodakov et al. |
| 6,562,127 | B1 | 5/2003 | Kud et al. |
| 6,579,359 | B1 | 6/2003 | Mynbaeva et al. |
| 6,583,050 | B2 | 6/2003 | Wenski et al. |
| 6,723,166 | B2 | 4/2004 | Kuhn et al. |
| 6,827,638 | B2 | 12/2004 | Kiuchi et al. |
| 6,861,360 | B2 | 3/2005 | Wenski et al. |
| 6,899,762 | B2 | 5/2005 | Wenski et al. |
| 7,064,073 | B1 | 6/2006 | U'ren |
| 7,081,420 | B2 | 7/2006 | Kamata et al. |
| 7,294,324 | B2 | 11/2007 | Powell et al. |
| 7,314,520 | B2 | 1/2008 | Powell et al. |
| 7,314,521 | B2 | 1/2008 | Powell et al. |
| 7,316,747 | B2 | 1/2008 | Jenny et al. |
| 7,323,051 | B2 | 1/2008 | Hobgood et al. |
| 7,399,217 | B1 | 7/2008 | Godshall |
| 7,422,634 | B2 | 9/2008 | Powell et al. |
| 7,438,760 | B2 | 10/2008 | Bauer et al. |
| 7,449,065 | B1 | 11/2008 | Powell et al. |
| 7,513,819 | B2 | 4/2009 | Kiuchi et al. |
| 7,531,433 | B2 | 5/2009 | Ellison et al. |
| 7,935,614 | B2 | 5/2011 | Schauer et al. |
| 8,075,647 | B2 | 12/2011 | Kawasaki et al. |
| 8,165,706 | B2 | 4/2012 | Pitney |
| 8,221,549 | B2 | 7/2012 | Maruyama |
| 8,384,090 | B2 | 2/2013 | Powell et al. |
| 8,395,164 | B2 | 3/2013 | Murphy et al. |
| 8,409,351 | B2 | 4/2013 | Robbins et al. |
| 8,435,866 | B2 | 5/2013 | Nishiguchi et al. |
| 8,436,366 | B2 | 5/2013 | Harada et al. |
| 8,716,718 | B2 | 5/2014 | Momose et al. |
| 8,860,040 | B2 | 10/2014 | Loboda et al. |
| 9,279,192 | B2 * | 3/2016 | Hansen ................. C30B 23/025 |
| 2002/0083892 | A1 | 7/2002 | Kondo et al. |
| 2003/0070611 | A1 | 4/2003 | Nakamura et al. |
| 2004/0081805 | A1 | 4/2004 | Furihata et al. |
| 2004/0134418 | A1 | 7/2004 | Hirooka |
| 2004/0266057 | A1 | 12/2004 | Nagasawa |
| 2005/0059247 | A1 | 3/2005 | Ikenaka |
| 2006/0042540 | A1 | 3/2006 | Futatsuyama et al. |
| 2006/0102068 | A1 | 5/2006 | Tsvetkov et al. |
| 2006/0107890 | A1 | 5/2006 | Hobgood et al. |
| 2006/0118037 | A1 | 6/2006 | Powell et al. |
| 2006/0180077 | A1 | 8/2006 | Suda et al. |
| 2006/0249073 | A1 | 11/2006 | Asaoka et al. |
| 2006/0267024 | A1 | 11/2006 | Murphy et al. |
| 2006/0289873 | A1 | 12/2006 | Rowland et al. |
| 2007/0051979 | A1 | 3/2007 | Kambayashi et al. |
| 2007/0176531 | A1 | 8/2007 | Kinoshita et al. |
| 2007/0221614 | A1 | 9/2007 | Sumakeris |
| 2007/0262322 | A1 | 11/2007 | Nakabayashi et al. |
| 2007/0290211 | A1 | 12/2007 | Nakayama et al. |
| 2008/0008641 | A1 | 1/2008 | Leonard et al. |
| 2008/0217627 | A1 | 9/2008 | Friedrichs et al. |
| 2008/0220620 | A1 | 9/2008 | Kawada et al. |
| 2008/0261401 | A1 | 10/2008 | Kerr et al. |
| 2008/0318359 | A1 | 12/2008 | Yonezawa et al. |
| 2009/0038541 | A1 | 2/2009 | Robbins et al. |
| 2009/0085044 | A1 | 4/2009 | Ohno et al. |
| 2009/0114148 | A1 | 5/2009 | Stahlbush et al. |
| 2009/0124060 | A1 | 5/2009 | Nagaya et al. |
| 2009/0134405 | A1 | 5/2009 | Ota et al. |
| 2009/0302328 | A1 | 12/2009 | Ohno et al. |
| 2009/0321747 | A1 | 12/2009 | Murphy et al. |
| 2009/0324896 | A1 | 12/2009 | Kato |
| 2010/0031877 | A1 | 2/2010 | Gupta et al. |
| 2010/0080956 | A1 * | 4/2010 | Fujimoto ................. C30B 23/00 428/141 |
| 2010/0119849 | A1 | 5/2010 | Nakamura et al. |
| 2010/0291756 | A1 | 11/2010 | Haeberlen et al. |
| 2010/0295059 | A1 | 11/2010 | Fujimoto et al. |
| 2011/0031505 | A1 | 2/2011 | Harada et al. |
| 2011/0056434 | A1 | 3/2011 | Yamaguchi et al. |
| 2011/0089431 | A1 | 4/2011 | Yagi et al. |
| 2011/0146565 | A1 | 6/2011 | Ishibashi et al. |
| 2011/0206929 | A1 | 8/2011 | Nakabayashi et al. |
| 2011/0233562 | A1 | 9/2011 | Harada et al. |
| 2011/0237078 | A1 | 9/2011 | Hirooka |
| 2011/0266556 | A1 | 11/2011 | Leonard et al. |
| 2011/0284871 | A1 | 11/2011 | Harada et al. |
| 2011/0306212 | A1 | 12/2011 | Sato et al. |
| 2012/0025153 | A1 | 2/2012 | Hirose et al. |
| 2012/0031330 | A1 | 2/2012 | Tsumori et al. |
| 2012/0060751 | A1 | 3/2012 | Urakami et al. |
| 2012/0061686 | A1 | 3/2012 | Nishiguchi et al. |
| 2012/0070605 | A1 | 3/2012 | Sasaki et al. |
| 2012/0070968 | A1 | 3/2012 | Shibagaki et al. |
| 2012/0103249 | A1 | 5/2012 | Gupta et al. |

(56) References Cited

U.S. PATENT DOCUMENTS

| | | |
|---|---|---|
| 2012/0114545 A1 | 5/2012 | Loboda et al. |
| 2012/0128892 A1 | 5/2012 | Toyoda et al. |
| 2012/0184113 A1 | 7/2012 | Inoue et al. |
| 2012/0241766 A1 | 9/2012 | Ohtsuka et al. |
| 2012/0248463 A1 | 10/2012 | Zhang |
| 2012/0280254 A1 | 11/2012 | Muto et al. |
| 2012/0285370 A1 | 11/2012 | Gupta et al. |
| 2013/0020585 A1 | 1/2013 | Ishibashi |
| 2013/0029158 A1 | 1/2013 | Aigo et al. |
| 2013/0032822 A1 | 2/2013 | Ishibashi |
| 2013/0071643 A1 | 3/2013 | Harada et al. |
| 2013/0099253 A1 | 4/2013 | Ohtsuka et al. |
| 2013/0122692 A1 | 5/2013 | Imai et al. |
| 2013/0126906 A1 | 5/2013 | Tomita et al. |
| 2013/0130593 A1 | 5/2013 | Kalenian et al. |
| 2013/0171402 A1 | 7/2013 | Straubinger et al. |
| 2013/0327265 A1 | 12/2013 | Inoue et al. |
| 2014/0021481 A1 | 1/2014 | Lee et al. |
| 2014/0054619 A1 | 2/2014 | Tseng et al. |
| 2014/0220296 A1 | 8/2014 | Loboda et al. |
| 2014/0220298 A1 | 8/2014 | Loboda |

FOREIGN PATENT DOCUMENTS

| | | |
|---|---|---|
| CN | 101155640 A | 4/2008 |
| CN | 101155676 A | 4/2008 |
| CN | 101490315 A | 7/2009 |
| CN | 101599428 A | 12/2009 |
| CN | 101724344 A | 6/2010 |
| CN | 101802273 A | 8/2010 |
| CN | 102107391 A | 6/2011 |
| CN | 102187019 A | 9/2011 |
| CN | 102257190 A | 11/2011 |
| CN | 102272351 A | 12/2011 |
| CN | 102484044 A | 5/2012 |
| CN | 102569055 A | 7/2012 |
| CN | 102656297 A | 9/2012 |
| CN | 102714143 A | 10/2012 |
| CN | 102859654 A | 1/2013 |
| CN | 102899723 A | 1/2013 |
| DE | 102009016132 A1 | 10/2010 |
| DE | 102010029755 A1 | 12/2011 |
| EP | 0712150 A1 | 5/1996 |
| EP | 0795050 B1 | 7/1999 |
| EP | 0967304 A1 | 12/1999 |
| EP | 1039512 A2 | 9/2000 |
| EP | 1179620 A1 | 2/2002 |
| EP | 0954623 B1 | 5/2002 |
| EP | 1215730 A1 | 6/2002 |
| EP | 1225257 A2 | 7/2002 |
| EP | 1255281 A2 | 11/2002 |
| EP | 1288348 A2 | 3/2003 |
| EP | 1306890 A2 | 5/2003 |
| EP | 1354987 A1 | 10/2003 |
| EP | 1403404 A1 | 3/2004 |
| EP | 1143033 B1 | 9/2004 |
| EP | 1491662 A1 | 12/2004 |
| EP | 1243674 B1 | 6/2005 |
| EP | 1659198 A1 | 5/2006 |
| EP | 1739726 A1 | 1/2007 |
| EP | 1785512 A1 | 5/2007 |
| EP | 1852527 A1 | 11/2007 |
| EP | 1855312 A1 | 11/2007 |
| EP | 1751329 B1 | 1/2008 |
| EP | 1901345 A1 | 3/2008 |
| EP | 1828448 B1 | 3/2010 |
| EP | 1721031 B1 | 11/2010 |
| EP | 2264223 A2 | 12/2010 |
| EP | 2314737 A2 | 4/2011 |
| EP | 1752567 B1 | 9/2011 |
| EP | 2371997 A1 | 10/2011 |
| EP | 2385158 A1 | 11/2011 |
| EP | 2394787 A1 | 12/2011 |
| EP | 2395133 A1 | 12/2011 |
| EP | 2405038 A1 | 1/2012 |
| EP | 2420599 A1 | 2/2012 |
| EP | 2484815 A1 | 8/2012 |
| EP | 2499247 A1 | 8/2012 |
| EP | 2557205 A1 | 2/2013 |
| EP | 1797225 B1 | 3/2013 |
| EP | 2570522 A1 | 3/2013 |
| EP | 2584594 A1 | 4/2013 |
| EP | 1790757 B1 | 8/2013 |
| EP | 2653591 A1 | 10/2013 |
| JP | H04-223330 A | 8/1992 |
| JP | H05-262599 A | 10/1993 |
| JP | H06-5567 A | 1/1994 |
| JP | H06-316499 A | 11/1994 |
| JP | 10-50616 A | 2/1998 |
| JP | 11-121311 A | 4/1999 |
| JP | 11-135464 A | 5/1999 |
| JP | 2000-235941 A | 8/2000 |
| JP | 2001-508597 A | 6/2001 |
| JP | 2001-291690 A | 10/2001 |
| JP | 2002-134375 A | 5/2002 |
| JP | 2003-086518 A | 3/2003 |
| JP | 2003-086816 A | 3/2003 |
| JP | 2003-249426 A | 9/2003 |
| JP | 2004-099340 A | 4/2004 |
| JP | 2004-292305 A | 10/2004 |
| JP | 2004-299018 A | 10/2004 |
| JP | 2005-051299 A | 2/2005 |
| JP | 2005-064392 A | 3/2005 |
| JP | 2005-508086 A | 3/2005 |
| JP | 2006-32655 A | 2/2006 |
| JP | 2006-066722 A | 3/2006 |
| JP | 2006-120897 A | 5/2006 |
| JP | 2006-143511 A | 6/2006 |
| JP | 2006-245128 A | 9/2006 |
| JP | 3854508 B2 | 12/2006 |
| JP | 2007-002268 A | 1/2007 |
| JP | 2007-080770 A | 3/2007 |
| JP | 2007-131504 A | 5/2007 |
| JP | 2007-230823 A | 9/2007 |
| JP | 2008-001537 A | 1/2008 |
| JP | 2008-004888 A | 1/2008 |
| JP | 2008-053178 A | 3/2008 |
| JP | 2008-053343 A | 3/2008 |
| JP | 2008-074661 A | 4/2008 |
| JP | 2008-074664 A | 4/2008 |
| JP | 2008-091656 A | 4/2008 |
| JP | 2008-115034 A | 5/2008 |
| JP | 2008-235740 A | 10/2008 |
| JP | 2008-538542 A | 10/2008 |
| JP | 2008-311541 A | 12/2008 |
| JP | 2009-081186 A | 4/2009 |
| JP | 2009-088223 A | 4/2009 |
| JP | 2009-182126 A | 8/2009 |
| JP | 2009-256146 A | 11/2009 |
| JP | 2009-295728 A | 12/2009 |
| JP | 2010-029995 A | 2/2010 |
| JP | 2010-045279 A | 2/2010 |
| JP | 2010-95397 A | 4/2010 |
| JP | 2010-510946 A | 4/2010 |
| JP | 2010-99830 A | 5/2010 |
| JP | 2010-109151 A | 5/2010 |
| JP | 2010-135789 A | 6/2010 |
| JP | 2010-228939 A | 10/2010 |
| JP | 2010-254520 A | 11/2010 |
| JP | 2010-254521 A | 11/2010 |
| JP | 2011-020860 A | 2/2011 |
| JP | 2011-073915 A | 4/2011 |
| JP | 2011-121847 A | 6/2011 |
| JP | 2011-122102 A | 6/2011 |
| JP | 2011-219297 A | 11/2011 |
| JP | 2011-233932 A | 11/2011 |
| JP | 2011-243619 A | 12/2011 |
| JP | 2011-254119 A | 12/2011 |
| JP | 4845142 B2 | 12/2011 |
| JP | 4850960 B2 | 1/2012 |
| JP | 2012-028565 A | 2/2012 |
| JP | 2012-051795 A | 3/2012 |
| JP | 2012-114210 A | 6/2012 |
| JP | 2012-246168 A | 12/2012 |

(56) References Cited

FOREIGN PATENT DOCUMENTS

| | | | |
|---|---|---|---|
| JP | 2013-014469 A | 1/2013 | |
| JP | 2013-023399 A | 2/2013 | |
| KR | 10-1999-0087978 A | 12/1999 | |
| KR | 10-2002-0032355 A | 5/2002 | |
| KR | 10-2004-0097175 A | 11/2004 | |
| KR | 10-2007-0063150 A | 6/2007 | |
| KR | 10-2007-0073954 A | 7/2007 | |
| KR | 10-2008-0007165 A | 1/2008 | |
| KR | 100845946 B1 | 7/2008 | |
| KR | 10-2009-0031573 A | 3/2009 | |
| KR | 10-2010-0096999 A | 9/2010 | |
| KR | 10-2012-0061920 A | 6/2012 | |
| KR | 10-2012-0101087 A | 9/2012 | |
| KR | 10-2012-0101097 A | 9/2012 | |
| WO | 1993/001914 A1 | 2/1993 | |
| WO | 1997/013013 A1 | 4/1997 | |
| WO | 2000/068474 A1 | 11/2000 | |
| WO | 2000/079570 A2 | 12/2000 | |
| WO | 2001/018872 A1 | 3/2001 | |
| WO | 2002/018670 A2 | 3/2002 | |
| WO | 2004/014607 A1 | 2/2004 | |
| WO | 2004/092453 A2 | 10/2004 | |
| WO | 2005/111277 A1 | 11/2005 | |
| WO | 2006/031641 A2 | 3/2006 | |
| WO | 2006/108191 A2 | 10/2006 | |
| WO | 2006/135476 A1 | 12/2006 | |
| WO | 2007/035570 A2 | 3/2007 | |
| WO | 2007/058774 A1 | 5/2007 | |
| WO | 2007/148486 A1 | 12/2007 | |
| WO | 2008/033994 A1 | 3/2008 | |
| WO | 2008/039914 A2 | 4/2008 | |
| WO | 2009/003100 A1 | 12/2008 | |
| WO | 2009/035095 A1 | 3/2009 | |
| WO | 2009/075935 A1 | 6/2009 | |
| WO | 2009/080177 A1 | 7/2009 | |
| WO | 2009/120505 A1 | 10/2009 | |
| WO | 2010/041497 A1 | 4/2010 | |
| WO | 2010/111473 A1 | 9/2010 | |
| WO | 2010/119792 A1 | 10/2010 | |
| WO | 2011/034850 A1 | 3/2011 | |
| WO | 2011/074453 A1 | 6/2011 | |
| WO | 2011/083552 A1 | 7/2011 | |
| WO | 2011/126145 A1 | 10/2011 | |
| WO | 2011/142074 A1 | 11/2011 | |
| WO | 2011/149906 A1 | 12/2011 | |
| WO | 2012/026234 A1 | 3/2012 | |
| WO | 2012/067112 A1 | 5/2012 | |
| WO | 2012/144614 A1 | 10/2012 | |
| WO | 2013/062380 A1 | 5/2013 | |

OTHER PUBLICATIONS

Decision of Patent Grant for Korean Patent Application No. 10-2015-7024047 dated Apr. 28, 2016.
Decision of Refusal for Japanese Patent Application No. 2015-539598 dated May 10, 2016.
Decision of Refusal for Japanese Patent Application No. 2015-556941 dated May 31, 2016.
Examination Report for European Patent Application No. 13818955.0 dated Aug. 16, 2016.
First Office Action for Chinese Patent Application No. 201380060888.1 dated Apr. 7, 2016.
International Search Report and Written Opinion for PCT/US2016/015773 dated May 13, 2016.
Notice of Grant for Japanese Patent Application No. 2015-523311 dated May 17, 2016.
Office Action for Chinese Patent Application No. 201380074938.1 dated Apr. 26, 2016.
Office Action for Chinese Patent Application No. 201480002722.9 dated Aug. 29, 2016.
Office Action for Chinese Patent Application No. 201480002722.9 dated Mar. 14, 2016.
Pre-Examination Report for Japanese Patent Application No. 2015-510524 dated Apr. 15, 2016.
Summons to Attend Oral Proceedings for European Patent Application No. 13765595.7 dated Jul. 14, 2016.
International Search Report and Written Opinion in PCT/US2015/042590 dated Oct. 16, 2015.
International Preliminary Report on Patentability in PCT/US2014/030022 dated Sep. 24, 2015.
Office Action for Japanese Patent Application No. 2015-523311 dated Jul. 21, 2015.
Office Action for Korean Patent Application No. 10-2015-7013789 dated Jul. 27, 2015.
Notice of Refusal for Japanese Patent Application No. 2015-510524 dated Oct. 6, 2015.
Final Rejection for Korean Patent Application No. 10-2015-7013789 dated Oct. 12, 2015.
Notice of Preliminary Rejection for Korean Patent Application No. 10-2010-7029355 dated Sep. 22, 2015.
Notice of Reasons for Refusal for Korean Patent Application No. 10-2015-7008990 dated Oct. 7, 2015.
Notice of Allowance in U.S. Appl. No. 14/585,101 dated Oct. 28, 2015.
Notice of Reasons for Rejection for Japanese Patent Application No. 2015-539598 dated Sep. 29, 2015.
Examination Report in European Patent Application No. 13765595.7 dated Oct. 29, 2015.
Second Office Action for Chinese Patent Application No. 201380020805.6 dated Dec. 9, 2015.
Office Action for Korean Patent Application No. 10-2015-7024047 dated Dec. 11, 2015.
Office Action for Japanese Patent Application No. 2015-556941 dated Jan. 12 2016.
Examination Report for European Patent Application No. 14721146.0 dated Jan. 26, 2016.
Notice of Final Rejection for Korean Patent Application No. 10-2015-7008990 dated Feb. 2, 2016.
Notice of Reasons for Rejection for Japanese Patent Application No. 2015-523311 dated Jan. 26, 2016.
Hull, B., et al., "Development of Large Area (up to 1.5 cm2) 4H—SiC 10 kV Junction Barrier Schottky Rectifiers." Materials Science Forum 600-603 (2008): 931-934.
Ioffe Physico-Technical Institute. "Electronic archive. New Semiconductor Materials. Characteristics and Properties. NSM Archive—Silicon Carbide (SiC)." http://www.ioffe.ru/SVA/NSM/Semicond/ accessed Aug. 29, 2013 (1998-2001): 1-72.
Kimoto, T., et al. "Homoepitaxial growth of 4H—SiC (0338) and nitrogen doping by chemical vapor deposition." Journal of crystal growth 249.1 (2003): 208-215.
Komiyama, J., et al., "Suppression of crack generation in GaN epitaxy on Si using cubic SiC as intermediate layers," Applied Physics Letters, vol. 88, No. 9, Feb. 27, 2006.
Kordina et al., "SiC epitaxial growth on larger area substrates: History and evolution", Silicon Carbide Epitaxy, 2012, pp. 1-25.
Larkin, D., et al. "Site-competition epitaxy for superior silicon carbide electronics." Applied Physics Letters 65.13 (1994): 1659-1661.
Lendenmann, H., et al. "Operation of a 2500V 150A Si—IGBT / SiC Diode Module." Materials Science Forum 338-342 (2000): 1423-1426.
Levinshtein, M., et al. (eds.). Properties of Advanced Semiconductor Materials: GaN, AlN, InN, BN, SiC, SiGe. Ch. 5: Silicon Carbide (SiC) (2001): 93-147.
Maximenko, S., et al. "Open core dislocations and surface energy of SiC." Materials Science Forum 527-529 (2006): 439-442.
Myers, R.L. et al., "High Epitaxial Growth Rate of 4H—SiC using Horizontal Hot-Wall CVD", Materials Science Forum, Jan. 2006, vols. 527-529, pp. 187-190.
Mynbaeva, M., et al. "Chemical vapor deposition of 4H—SiC epitaxial layers on porous SiC substrates." Applied Physics Letters 78.1 (2001): 117-119.
Chen, W., et al., "Growth and characterization of 4H—SiC epilayers on substrates with different off-cut angles." Journal of applied physics 98.11 (2005): 114907.

(56) References Cited

OTHER PUBLICATIONS

Chen, Y., et al. "Studies of the Distribution of Elementary Threading Screw Dislocations in 4H Silicon Carbide Wafer." Materials Science Forum 600-603 (2007): 301-304.
Chen, X.D., et al., "Deep Level Defect in Si-implanted GaN n+-9 Junction," Applied Physics Letters, vol. 82, No. 21, May 2003, pp. 3671-3673.
Cho, H., et al., "Isolation of AlGaN/GaN HEMTs on Si Substrate Using Argon-Ion Implantation Method," 16th Korea Semiconductor Conference, 2009, pp. 74-75.
Chung, G., et al. "4H—SiC Epitaxy with Very Smooth Surface and Low Basal Plane Dislocation on 4 Degree Off-Axis Wafer." Materials Science Forum 679-680 (2011): 123-126.
Dmitriev, V., et al. "Growth of SiC and SiC—AlN solid solution by container-free liquid phase epitaxy." Journal of crystal growth 128.1 (1993): 343-348.
Gupta, A., et al. "Status of Large Diameter SiC Single Crystals." Materials Science Forum 717-720 (2012): 3-8.
Gutkin, M., et al. "Micropipe Reactions in Bulk SiC Growth." Silicon Carbide—Materials, Processing and Applications in Electronic Devices (2011): 187-206.
Hardin, C.W., et al., "Fixed Abrasive Diamond Wire Saw Slicing of Single-Crystal Silicon Carbide Wafers," Materials and Manufacturing Processses, vol. 19, No. 2, pp. 355-367, 2004.
Hecht, C., et al. "High-Performance Multi-Wafer SiC Epitaxy—First Results of Using a 10×100mm Reactor." Materials Science Forum 645-648 (2010): 89-94.
Tairov, Y., et al., "Progress in controlling the growth of polytypic crystals." Progress in Crystal Growth and Characterization 7.1 (1983): 111-162.
Thomas, B., et al. "Properties and suitability of 4H—SiC epitaxial layers grown at different CVD systems for high voltage applications." Materials Science Forum 457-460 (2004): 181-184.
Tupitsyn, E., et al. "Controllable 6H—SiC to 4H—SiC polytype transformation during PVT growth." Journal of Crystal Growth 299.1 (2007): 70-76.
Wagner, G., et al. "Vapour phase growth of epitaxial silicon carbide layers." Progress in crystal growth and characterization of materials 47.2 (2003): 139-165.
Wan, J., et al. "A comparative study of micropipe decoration and counting in conductive and semi-insulating silicon carbide wafers." Journal of Electronic Materials. 34.10 (2005): 1342-1348.
Wan, J., et al. "A New Method of Mapping and Counting Micropipes in SiC Wafers." Materials Science Forum 527-529 (2006): 447-450.
Wan, J., et al., "Scaling of chlosilane SiC CVD to multi-wafer epitaxy system." Materials Science Forum 556-557 (2007): 145-148.
Wolf, S., et al. Silicon Processing for the VLSI Era. vol. 1—Process Technology. Ch. 1: Silicon: Single-Crystal Growth and Wafering (1986): 1-35.
Yamamoto, N., et al., "Slicing of rotating SiC ingot by electric discharge machining," Materials Science Forum, Jan. 2013.
Yashiro, H., et al. "Development of Lapping and Polishing Technologies of 4H—SiC Wafers for Power Device Applications." Materials Science Forum 600-603 (2009): 819-822.
Zhou, L., et al. "Chemomechanical polishing of silicon carbide." Journal of the Electrochemical Society 144.6 (1997): L161-L163.
Neudeck, P. "Electrical impact of SiC structural crystal defects on high electric field devices." Materials Science Forum 338-342 (2000): 1161-1166.
Neudeck, P., et al. "Performance limiting micropipe defects in silicon carbide wafers." Electron Device Letters, IEEE 15.2 (1994): 63-65.
Ogunniyi, A., et al. "The benefits and current progress of SiC SGTOs for pulsed power applications." Solid-State Electronics 54.10 (2010): 1232-1237.
Oka, T., et al., "AlGaN/GaN Recessed MIS-Gate HFET With High-Threshold-Voltage Normally-Off Operation for Power Electronics Applications," IEEE Electron Device Letters, vol. 29, No. 7, Jul. 2008, pp. 668-670.
Powell, A., et al. "Large Diameter 4H—SiC Substrates for Commercial Power Applications." Materials Science Forum 157-460 (2004): 41-46.
Powell, J., et al. "Process-Induced Morphological Defects in Epitaxial CVD Silicon Carbide." physica status solidi (b) 202.1 (1997): 529-548.
Powell, J., et al. "Sources of Morphological Defects in SiC Epilayers." Transactions Third International High-Temperature Electronics Conference, Sandia National Laboratories 1 (1996): II-3-II-8.
Radeker, W.S., et al., "A Hierarchy of Slurry Reprocessing Options," TMS Conference Papers, Feb. 14-18, 2010, Seattle, WA.
Sanchez, E., et al. "Thermal decomposition cavities in physical vapor transport grown SiC." Materials Science Forum 338.1 (2000):55.58.
Schulze, N., et al. "Near-equilibrium growth of micropipe-free 6H—SiC single crystals by physical vapor transport." Applied Physics Letters 72.13 (1998): 1632-1634.
Tairov, Y., et al. "General principles of growing large-size single crystals of various silicon carbide polytypes." Journal of Crystal Growth 52 (1981): 146-150.
Wafer Slicing Technology for Solar Photovoltaic Cells, Applied Materials, Apr. 2011.
International Application No. PCT/US2013/059064, International Search Report and Written Opinion, dated Nov. 18, 2013.
International Application No. PCT/US2013/058996, International Search Report and Written Opinion, dated Nov. 27, 2013.
International Application No. PCT/US2013/077189, International Search Report and Written Opinion, dated Mar. 21, 2014.
International Application No. PCT/US2013/077285, International Search Report and Written Opinion, dated Apr. 7, 2014.
International Application No. PCT/US2013/077291, International Search Report and Written Opinion, dated Apr. 4, 2014.
International Search Report and Written Opinion in PCT/US2015/015842 dated Jul. 29, 2015.

* cited by examiner

Figure 1 – Prior Art

METHOD FOR MANUFACTURING SIC WAFER FIT FOR INTEGRATION WITH POWER DEVICE MANUFACTURING TECHNOLOGY

RELATED APPLICATION

This application is a continuation of U.S. patent application Ser. No. 14/585,101, filed on Dec. 29, 2014 (now U.S. Pat. No. 9,279,192), which claims priority benefit from U.S. Provisional Application No. 62/030,490, filed on Jul. 29, 2014, the entire content of which is incorporated herein by reference.

BACKGROUND

1. Field

This disclosure relates to manufacturing of power devices and, specifically, for manufacturing of large diameter wafers used for power devices.

2. Related Art

Silicon carbide, SiC, is a crystalline semiconductor material, recognized by those familiar with materials science, electronics and physics as being advantageous for wide band gap properties and also for extreme hardness, high thermal conductivity and chemical inert properties. These properties make SiC a very attractive semiconductor for fabrication of power semiconductor devices, enabling power density and performance enhancement over devices made from more common materials like silicon.

The most common forms of SiC consist of cubic or hexagonal arrangements of atoms. The stacking of Si and C layers can take on many forms, known as polytypes. The type of silicon carbide crystal is denoted by a number denoting the number of repeat units in the stacking sequence followed by a letter representing the crystalline format. For example the 3C—SiC polytype refers to a repeat unit of 3 and a cubic (C) lattice, while a 4H—SiC polytype refers to repeat unit of 4 and a hexagonal (H) lattice.

The different silicon carbide polytypes have some variations in materials properties, most notably electrical properties. The 4H—SiC polytype has the relatively larger bandgap while the 3C—SiC has a smaller bandgap, with the bandgaps for most other polytypes falling in between. For high performance power device applications when the bandgap is larger, the material is more capable, in theory, to offer relatively better high power and thermal conductivity performance.

SiC crystals do not occur in nature and as such must be synthesized. Growth of SiC crystals can be executed by sublimation, also referred to as physical vapor transport, or chemical vapor deposition.

Growth of SiC by sublimation is very challenging. Temperatures in excess of 2000 C are required to generate as vapor stream of Si and C species by sublimation, which places great limitations on the reaction cell components and the furnace design. Originally SiC abrasive materials formed by processes like the Acheson method were used as the source of the Si and C atoms for the crystal, and as the technology matured groups developed means to synthesize SiC source powder specifically for SiC crystal growth. The growth is usually performed in a graphite container within a vacuum chamber. The graphite container is heated by either resistive methods or induction methods. The container is insulated in a careful manner so as to create controlled temperature gradients within the volume. A seed crystal is used and usually shaped like a plate or disc. The seed crystal is typically oriented with its growth surface facing the source material. The location of the seed crystal in the container is designed such that when the container is heated the seed is at a relatively lower temperature position, while the Si—C source materials are at the higher temperature position. When the container is heated to a temperature sufficient to sublime the source material, the vapors will travel towards the low temperature region and condense on the seed crystal. While this appears simple in concept, in practice the growth of SiC is very complicated and recognized by those who practice as very difficult to perform.

Historically, initial progress in SiC sublimation-based crystal growth is described first by Lely (U.S. Pat. No. 2,854,364—1958) whose method of unseeded crystal growth resulted in small hexagonal SiC platelets. In the 1970s and 1980s the art to produce the first crystals of size attractive for producing devices was done in Russia by Tairov and Tsvetkov (Journal of Crystal Growth, 52 (1981) p. 146-50 and *Progress in Controlling the Growth of Polytypic Crystals in Crystal Growth and Characterization of Polytype Structures*, P. Krishna, ed., Pergammon Press, London, p. 111 (1983)). Their approach used a Lely crystal as a seed, and conducted growth by sublimation and transport as described above. These results showed methods for polytype control by choice of seeds, pressure control and temperature gradients. Later, Davis (U.S. Pat. No. 4,866,005—1989) revealed improvements by judicious selection of source materials and gradient controls. Refinements on the methods of Tairov, Tsvetkov and Davis continue to be revealed to this day.

FIG. 1 illustrates a generic arrangement for growth of SiC crystals by physical vapor transport, indicative of the prior art. PVT reaction cell 40 having lid 55 is illustrated which is configured for SiC crystal growth. The reaction cell 40 is typically formed from a graphite vessel. Granulized SiC or silicon and carbon material 42 is placed in the bottom of the cell. Positioned in the upper portion of the vessel is a seed crystal 48 mounted to the inside of the top of the cell, e.g, clamped or bonded to lid 55. Notably, in the configuration of FIG. 1, during processing the back surface of the seed 48 contacts the bottom surface of the lid 55, whether by physical attachment, such as adhesive or clamp, or by pressure differential, as explained in JP 2011-20860.

The entire vessel is surrounded with insulation 54 such as graphite felt or foam. The reaction cell 40 is placed in a vacuum furnace 70 which is pumped by a vacuum pump 90. The vacuum furnace 70 may be comprised of steel if the cell is resistively heated, or it may be comprised of dielectric, e.g., glass, if the cell is inductively heated. In the embodiments shown, the vacuum furnace is comprised of glass and is heated by an RF induction coil 72. Silicon and carbon evaporate from the source material 42 and condense onto the seed 48. Silicon and carbon that has not condensed onto the seed is diffused out of the reaction vessel and into the vacuum furnace. This diffusion is driven by pressure gradient between the interior of the reaction vessel and the vacuum furnace. Gases that are being injected into the vacuum furnace, such as nitrogen (82, 84), argon (86, 88), and dopants, diffuse through the graphite crucible walls and into the reaction vessel. This diffusion is driven by concentration gradient between the vacuum chamber and the interior of the reaction vessel.

When methods to produce larger crystals emerged, focus also moved to control defects in the crystals. Defects can be categorized as inclusions and crystal dislocations. The primary crystalline defects in SiC crystals are screw dislocations. Among these are a special case known as micropipes or hollow core screw dislocations. Additionally, there are basal plane dislocations and threading edge dislocations. These defects originate from many sources. For example, defects contained in the seed crystal can be passed to the newly grown crystal volume. Stresses arising from temperature gradients and thermal expansion mismatch and imparted to the seed and crystal during growth can result in formation of dislocations. Deviation of the stoichiometry in the sublimation vapor stream from that needed to form SiC can result in unstable polytype growth-in turn leading to polytype inclusions in the grown crystal, which lead to dislocation formation at the polytype boundaries. Even interactions between dislocations can create or eliminate dislocations.

SiC crystals produced by methods identified have large concentrations of dislocations. As of this filing, the commonly reported values of screw dislocation and basal plane concentration are nominally 5000-10000/$cm^2$, respectively. The dislocations are most commonly assessed by sectioning the crystal in the plane normal to the crystal axis of symmetry. Etching the exposed crystal surface with molten salt, like potassium hydroxide, at temperatures in the 350-500 C range will reveal the dislocations. Each dislocation type has a unique shape so they can be uniquely counted. The dislocations are commonly counted and reported as a number divided by the inspection area. This characterization method is useful as it allows for easy correlation of defects contained in planar semiconductor devices formed on the crystal plane. There are many examples in the literature which show that dislocations are not uniformly distributed in the plane of observation. The large count of dislocations makes it very impractical to count every single one, especially as today inspections can be required on sections greater than or equal to the equivalent of 100 mm diameter circles. So the etched area is sampled to determine the amount of dislocations. Incorrect sampling methods can lead to errors in the estimation of the dislocation concentration associated with larger crystals. In most reports, the details of the sampling method are not provided, so replication of results can often be difficult, if not impossible.

Scientists experienced in solid state physics and semiconductor devices know that dislocations result in device performance below the theoretical properties of the material. Therefore, modern effort focused on improvements of semiconductor SiC crystal quality look to identify and control the factors which can reduce defects originating in crystal growth.

Once large enough crystals are produced, the crystal must be cut and fabricated into wafers to fit into equipment for fabricating semiconductor devices using planar fabrication methods. As many semiconductor crystals (e.g. silicon, gallium arsenide) have been successfully developed and commercialized into wafer products, the methods to fabricate wafers from bulk crystals are known. A review of the common approaches to, and requirements for wafer fabrication and standard methods of characterization can be found in Wolf and Tauber, Silicon Processing for the VLSI Era, Vol. 1-Process Technology, Chapter 1 (Lattice Press—1986).

Due to its hardness, fabrication of SiC into wafer substrates presents unique challenges compared to processing other common semiconductor crystals like silicon or gallium arsenide. Modifications must be made to the machines and the choices of abrasives changed beyond commonly used materials. The modifications made on common wafer fabrication techniques in order to accommodate SiC are often kept as proprietary information. It has been reported that substantial subsurface damage is observable on mirror polished SiC wafers, and this can be reduced or removed by using chemical enhanced mechanical polishing methods similar to that used in the silicon industry (Zhou, L., et al., *Chemomechanical Polishing of Silicon Carbide*, J. Electrochem. Soc., Vol. 144, no. 6, June 1997, pp. L161-L163).

In order to build semiconductor devices on SiC wafers, additional crystalline SiC films must be deposited on the wafers to create the device active regions with the required conductivity value and conductor type. This is typically done using chemical vapor deposition (CVD) methods. Techniques for growth of SiC by CVD epitaxy have been published from groups in Russia, Japan and the United States since the 1970's. The most common chemistry for growth of SiC by CVD is a mixture of a silicon containing source gas (e.g monosilanes or chlorosilanes) and a carbon containing source gas (e.g. a hydrocarbon gas). A key element to growth of low defect epitaxial layers is that the substrate surface is tilted away from the crystal axis of symmetry to allow the chemical atoms to attach to the surface in the stacking order established by the substrate crystal. When the tilt is not adequate the CVD process will produce three dimensional defects on the surface, and such defects will result non-operational semiconductor devices. Surface imperfections, such as cracks, subsurface damage, pits, particles, scratches or contamination will interrupt the replication of the wafer's crystal structure by the CVD process (see, for example, Powell and Larkin, *Phys. Stat. Sol.* (b) 202, 529 (1997)). It is important that the polishing and cleaning processes used to fabricate the wafer minimize surface imperfections. In the presence of these surface imperfections several defects can be generated in the epitaxial films including basal plane dislocations and cubic SiC inclusions (see for example, Powell, et. al. *Transactions Third International High-Temperature Electronics Conference, Volume* 1, pp. II-3-II-8, Sandia National Laboratories, Albuquerque, N. Mex. USA, 9-14 Jun. 1996).

Defects in SiC are known to limit or destroy operation of semiconductor devices formed over the defects. Neudeck and Powell reported that hollow core screw dislocations (micropipes) severely limited voltage blocking performance in SiC diodes (P. G. Neudeck and J. A. Powell, *IEEE Electron Device Letters, vol.* 15, *no.* 2, pp. 63-65, (1994)). Neudeck reviewed the impact of crystal (wafer) and epitaxy originated defects on power devices in 1994, highlighting limitations of power device functionality due to screw dislocations and morphological epitaxy defects (*Neudeck, Mat. Sci. Forum, Vols* 338-342, pp. 1161-1166 (2000)). Hull reported shift to lower values in the distribution of high voltage diode reverse bias leakage current when the diodes were fabricated on substrates having lower screw dislocation density (Hull, et. al., *Mat. Sci. forum, Vol.* 600-603, p. 931-934 (2009)). Lendenmann reported forward voltage degradation in bipolar diodes was linked to basal plane dislocations in the epilayer that originate from basal plane dislocations in the substrate (Lendenmann et. al., *Mat. Sci. Forum, Vols* 338-342, pp. 1161-1166 (2000)).

While much progress has been achieved to improve SiC crystals and use the material as substrates for transistors and diodes, adoption of the processes and devices in mainstream power electronics has been slow. Today, most power semiconductor device manufacturing is done with silicon substrates of diameter 150 mm or larger. These substrates have extreme requirements for purity, surface contamination, particles, thickness uniformity and flatness. Purity and surface contamination issues on silicon substrates are critical in a silicon device fabrication process as the common impurities will diffuse in silicon and then aggregate at surfaces leading to poor performance in devices fabricated on the substrate surfaces. Power device fabrication uses relatively large die size and to achieve high fabrication and operation yield the crystal quality of the substrate material reflects a high degree of perfection. Modern methods for fabrication of power devices use silicon substrates which have perfect crystal quality, i.e. low dislocation density and low surface defects.

Semiconductor SiC is a promising material for the next generation power semiconductor devices. Adoption of SiC wafers for power electronics manufacturing has been slow since most SiC substrates produced have relatively small diameter (76-100 mm), have large defect density and are more expensive than silicon. The use of wafers other than silicon with diameter less than 150 mm makes power device manufacturing more costly and adds complexity to handle the small wafers with equipment designed for diameters of 150 mm or larger. To solve the problem of adoption, a SiC substrate process must be developed which can emulate all the following attributes:

Wafer diameter of 150 mm or larger
  Wafer thickness, bevel and flatness comparable to the analogous silicon wafer or compatible with silicon process equipment
  Very low crystalline defect density
  Very low levels of surface contamination so as to prevent cross contamination with silicon processes performed on shared equipment.
  Compatibility with SiC epitaxy to enable substrate suitable for device manufacturing.

Growth of SiC crystals with diameter equal to or larger than 150 mm is very difficult. Traditional sublimation methods are limited by the amount of Si/C source material that can be contained in the reaction cell. To grow a crystal of 150 mm diameter or larger requires extreme amounts of source material which can take up much volume in the reaction cell and furnace. This dictates a very large reaction cell. Larger cell geometry can result in large radial and axial temperature gradients, which in turn lead to large stresses in the crystal and or excessive growth rates. The stresses result in defect formation in the crystal while large growth rates lead to challenges in controlling the polytype of the crystal. Large defect density (total dislocations greater than 2E4/$cm^2$) are not low enough to make reliable power devices. A compact cell design may limit temperature gradients, even to the point where there is not enough driving force to support vapor transport and the resulting crystals are very small, impractical for cutting substrates.

Discussion of crystals of SiC with diameter of 150 mm and low dislocation density is discussed in the prior art. Fujimoto, US 2010/0295059 A1, discloses a method of growing SiC crystals with low dislocation density by sublimation with comments that the method can support the ability to grow crystals to diameter of 250 mm, but the examples provided are all below 100 mm diameter. Fujimoto argues the extension of the process to diameter of up to 250 mm purely on the basis of dislocation density control and without any insight as to how to scale the sublimation process to accommodate large crystals. Nakabayashi, US 201110206929 A1 discloses a method of growing SiC crystals with low dislocation density by sublimation with comments that the method can support the ability to grow crystals to diameter of 300 mm, but the examples are all in the range of 75-105 mm. Like Fujimoto, any detail on the scaling of the process to accommodate large crystals is absent; only the method of defect control is discussed. Other references disclosing large diameter wafers include U.S. Pat. No. 8,747,982 and U.S. Pat. No. 8,741,413.

Kondo (Mat. Sci. Forum Vols. 778-780 (2014) p. 17) discloses a method for growing crystals of silicon carbide of 150 mm diameter by a method known as the repeated A face method. The results show low defect density. Kondo does not discuss details pertaining to the extension of the method for producing 4H—SiC crystals with diameters larger than 150 mm by sublimation.

None of the aforementioned patents disclose methods of making large diameter substrates from the large crystals of SiC that are suitable for use in the fabrication of power devices. Moreover, none raises or addresses the issue of thermal gradient and stresses that can be developed when using larger r4eaction cells for larger crystals.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

U.S. Patent publication 2012/0114545 to Loboda, discloses a method for growing large ingots of silicon carbide up to 150 mm diameter wherein the Si/C source composition and sublimation methods are improved to deliver large crystals of 4H SiC. The subject matter of this disclosure illustrates that the following integrated fabrication strategy can produce a SiC substrate that closely emulates the attributes of silicon substrates and can be used in a manufacturing process that is also used to make silicon devices:

SiC substrate of diameter larger than 149 mm, generally 150+/−1 mm or 200+/−1 mm, which is the 4H—SiC polytype and the substrate is oriented such that surface of the substrate of the crystal is tilted 3.5-4.4 degrees away from the c-axis toward the <11-20> direction. For tighter requirements, the substrate of the crystal is tilted 3.8-4.2 degrees away from the c-axis toward the <11-20> direction.
  In order to produce very large diameter crystals of 4H—SiC, stresses imparted during sublimation crystal growth must be carefully managed. The stresses originate in temperature gradients and coefficient of expansion mismatch between the crystal and the reaction cell in which it grows. Proper stress management for growing large SiC crystals includes a graphite crucible reaction cell which is filled with a charge comprised of silicon and carbon atoms, and a seed crystal is placed at the top of the crucible such that it is not rigidly attached to the crucible, and the support of the seed does not transfer stress to the seed as a result of coefficient of expansion mismatch during heating or cooling. The seed attachment and the crucible design allow for the sublimed vapors to both condense on the wafer surface as well as allow some vapor to pass around the wafer and escape the volume of the crucible containing the grown crystal.
  In order to grow crystals of size that can yield many substrates of diameter larger than 149 mm it is discovered that there is a critical relationship between the volume of the inside of the reaction cell and the volume of the targeted crystal size (diameter and length).

Specifically, in addition to being of diameter larger than 149 mm, the grown crystal must be large enough in volume to yield many slices which can be converted into substrates for device fabrication, with a minimum number of 10 or more to be practical for manufacturing. The reaction cell should have enough volume to accommodate the volume of the grown crystal as well as that of the volume of the source material needed to grow the crystal. As such, the inner volume of the reaction cell must be in the range of 6-12 times the expected volume of the final crystal. The preferred designs correspond to a reaction cell having an inner height to inner diameter ratio in the range of from 0.8 to 4.0.

The resistivity of the SiC crystal must also be controlled to a low value and tight range to be useful in fabrication of power devices. The substrates made from the crystal become part of the current path in a typical vertical power device design and if the resistivity is high the devices made on the substrate will be inefficient. Resistivity control in large diameter SiC crystal growth is accomplished by adding N2 gas to the crystal growth process. In addition to being of sufficient volume to yield a sufficient number of substrates, it is found that all substrates from a crystal and among different crystals must exhibit a common resistivity range. Using the methods described, it is found that the range of resistivity values measured on wafers cut from a single crystal are in the range 0.013-0.022 ohm-cm. This corresponds to a nitrogen donor concentration larger than $3E18/cm^2$, and up to about $6E18/cm^2$.

In order to be able to introduce SiC wafers into silicon processing system and obtain acceptable process characteristics, the surface of the SiC wafers should be properly prepared. Specifically, the surface contamination and particles should be controlled to specified levels. Similarly, metal contamination should be controlled to specified levels. The density of dislocations and scratches also needs to be maintained below a specified level. All of the above specifications will be described in more details below. It is noted that when processing silicon wafers, an oxidation process can be used to condition to wafers' surface prior to the deposition process. However, SiC does not oxidize. Consequently, the standard oxidation process is ineffective for conditioning the SiC surface, such that the SiC wafers need to be prepared as disclosed herein, prior to their introduction into the deposition processing chamber.

According to specific disclosed embodiments, a polished 4H—SiC silicon carbide semiconductor substrate is disclosed, which is prepared for epitaxial growth, the substrate having: a diameter of from 149 to 152 mm; a thickness 365-675 mm; a beveled circumferential edge (e.g., with maximum angle of 22.5+/−0.2 degrees with respect to fabrication surface of the substrate); a total thickness variation (TTV) range from 0.5 um to 5 um, and warp range from 1 um to 40 um; a surface metal contamination level measured by TXRF on either C face or Si face of the substrate as a sum of the areal density of Na, Mg, Al, Ca, K, Mg between from $25E10/cm^2$ to $275E10/cm^2$ and the sum of areal density of atoms P, Ni, Fe, Co, Cu, Mn between from $10E10/cm^2$ to $150E10/cm^2$; a median areal density of crystalline dislocations, comprised of threading screw dislocations, basal plane dislocations and micropipes, in the substrate is between from $1/cm^2$ to $2600/cm^2$; an aggregated scratch length in the range from Sum to 5000 um; and, particle count ranging from 5 to 500 total particles with diameter range from 0.5 um to 10 um. In some embodiments, the substrate may be oriented such that [0001] surface of the substrate is tilted 3.5-4.4 degrees away from the c-axis toward the <11-20> direction. In some embodiments, when the substrate is etched in molten KOH and measured at 19 sites, each site being 1×1 $mm^2$, the sites being uniformly distributed across the fabrication surface, a median areal density of basal plane dislocations is in the range from $1/cm^2$ to $2500/cm^2$, and a median areal density of threading screw dislocations is in the range from $0/cm^2$ to $400/cm^2$, and at least one site on the substrate measures zero screw dislocations. Additionally, the within substrate resistivity values may range from 0.013 ohm-cm to 0.022 ohm-cm. The substrate may further comprise one or more SiC homoepitaxial layers deposited on silicon or carbon surface, with composite thickness in range of from 1.5 um to 160 um, and at least one of the epitaxial layers having an n-type or p-type dopant atom with concentration in range of from $1E14/cm^3$ to $3E19/cm^3$. The epitaxial film may be fabricated by an epitaxy process comprising: i. loading one or more substrates into a CVD epitaxy system; ii. heating the substrate(s) to an elevated temperature which is sufficient to etch the fabrication surface when the substrate is exposed to a gas mixture of hydrogen and hydrogen chloride; and, iii. depositing the epitaxial films on the substrates using a gas mixture which included at least one gas with a chlorine atom. In some embodiments, the surface metal contamination level measured by TXRF on either the C face or Si face of the substrate as the sum of the areal density of Na, Mg, Al, Ca, K, is between from $25E10/cm^2$ to $275E10/cm^2$ and the sum of areal density of atoms P, Ni, Fe, Co, Cu, Mn is between from $10E10/cm^2$ to $150E10/cm^2$. Also, when the SiC homoepitaxial layer is etched in molten KOH and measured at 19 sites distributed across a surface, median areal density of screw dislocations is in the range of from $0/cm^2$ to $400/cm^2$, and at least one site measured zero screw dislocations, and median areal density of basal plane dislocations is in the range of from $0/cm^2$ to $20/cm^2$, and at least one site measured zero basal plane dislocations.

According to some disclosed embodiments, a method to grow a 4H—SiC crystal with maximum diameter exceeding 149 mm is provided, comprising: i. preparing a hollow, cylindrical graphite reaction cell having internal volume from 4000 $cm^3$ to 16000 $cm^3$, and an inner diameter to inner height ratio in the range of from 0.8 to 4.0; ii. introducing a source of silicon atoms and a source of carbon atoms into the reaction cell; iii. placing 4H—SiC silicon carbide seed crystal inside the reaction cell; iv. sealing the reaction cell and surrounding the reaction cell with graphite insulation; v. introducing the cylindrical reaction cell into a vacuum furnace; vi. evacuating the furnace; vii. filling the furnace with a gas mixture which is substantially inert gas to a pressure near atmospheric pressure; viii. heating the cylindrical reaction cell in the furnace to a temperature in the range of from 1975 C to 2500 C; ix. reducing the pressure in the furnace to less than 50 torr but not less than 0.05 torr; and, x. allowing for sublimation of the source and condensation of silicon and carbon vapors on the seed.

In the disclosed method, the source of silicon atoms may comprise a mixture comprising polysilicon chips. In some particular embodiments, the sublimation may be stopped when the volume of the crystal reaches one twelfths to one sixth of internal volume of the reaction cell. The method may further comprise slicing the crystal in a direction such that resulting wafers have surface that is tilted from 3.5 to 4.4 degrees away from c-axis toward <11-20> direction. The method may also further comprise depositing one or more SiC homoepitaxial layers on a silicon or carbon surface, with composite thickness in range of from 1.5 um to 160 um, and at least one of the epitaxial layers having an n-type or p-type dopant atom with concentration in range of from $1E14/cm^3$ to $3E19/cm^3$.

Depositing one or more SiC homoepitaxial layers may comprise: i. placing one or more substrates in a CVD epitaxy system; ii. heating the substrates to an elevated temperature which is sufficient to etch surface of the substrate when the substrate is exposed to a gas mixture of hydrogen and hydrogen chloride; and, iii. depositing the epitaxial films on the substrates using a gas mixture which included at least one gas with a chlorine atom.

In some embodiments, the surface metal contamination level measured by TXRF on either the C face or Si face of the substrate as the sum of the areal density of Na, Mg, Al, Ca, K, Mg is between from $25E10/cm^2$ to $275E10/cm^2$ and the sum of areal density of atoms P, Ni, Fe, Co, Cu, Mn is between from $10E10/cm^2$ to $150E10/cm^2$. Additionally, when the SiC homoepitaxial layer is etched in molten KOH and measured at 19 sites distributed across a surface, median areal density of screw dislocations is in the range of from $0/cm^2$ to $400/cm^2$, and at least one site measured zero screw dislocations, and median areal density of basal plane dislocations is in the range of from $0/cm^2$ to $20/cm^2$, and at least one site measured zero basal plane dislocations. The nitrogen donor concentration in the sliced wafer may be larger than $3E18/cm^2$, and up to about $6E18/cm^2$. The resistivity values measured on wafers cut from the single crystal may be in the range of from 0.013 to 0.022 ohm-cm.

Also disclosed is a method for epitaxial growth of SiC epitaxy layer over an SiC wafer, comprising placing SiC wafer in an epitaxial growth chamber; performing a pre-growth cleaning step of heating the wafer to a temperature in the range of 1400-1600° C. and then exposing the wafer to a gas that will etch the surface of the wafer. In some embodiments, the gas comprises a mixture of hydrogen and hydrogen chloride. After the pre-growth cleaning step the method proceeds to an epitaxial growth step wherein one or more chemical gases containing chlorine is flowed into the chamber.

The method may further include the steps of, prior to placing the wafer in the epitaxial growth chamber, polishing of the substrate with silica or alumina abrasives, using cloth pads, and at temperature in the range of 30-60° C., so as to reduce surface roughness of the wafer to less than 1 nm. Additionally, after the polishing of the wafer, the method may include the steps of cleaning the wafer using acidic solutions (of pH less than 4) to remove particles and residual metallic contamination. After the polishing step, the wafer may be cleaned in an ultrasonic cleaner and scrubbed with polymer brush (using Polyvinyl alcohol (PVA) brushes). The cleaning and scrubbing steps may be followed by spin rinsing and drying.

In some embodiments, the wafer for the epitaxial growth is obtained by slicing an SiC crystal to produce 4H—SiC wafers, such that resulting surface of the wafer is at an angle of 4 degrees away from the c-axis toward the <11-20> direction. The edges of the wafer is then chamfered to an angle of 22.5+/−0.1 degrees.

Other features and advantages of the disclosed invention will become apparent from the detailed description provided below, relating to exemplary embodiments.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

A crystal of SiC is grown using physical vapor transport in a sublimation system. In the embodiments described, the crystal is grown to have a diameter that yields wafers having diameter of at least 150 mm or 200 mm. Additionally, provisions are made to drastically reduce stress and thereby minimize defects within the grown crystal. The resistivity is control by proper inclusion of nitrogen during the growth process.

Embodiments of the method described herein provide several advantages over prior methods and apparatus for seed crystal growth. Most prior art systems physically connects, e.g., adhere, the seed with contact between the back surface of the seed and the top of the crucible or reaction cell, or to the lid. Such contact is unnecessary and may be detrimental to crystal formation. By minimizing the contact between the seed and the cell, the stresses imparted to the crystal during growth are also minimized, thus improve the quality of the grown crystal as evidenced by the low crystal defect density.

Various disclosed configurations of the reaction cell disclosed herein minimize damage to or bending of the seed crystal during the mounting process, and because the seed crystal is mechanically decoupled from the reaction cell, the seed crystal may expand and contract independently of the reaction cell during growth, thus minimizing stresses.

Figure 2:
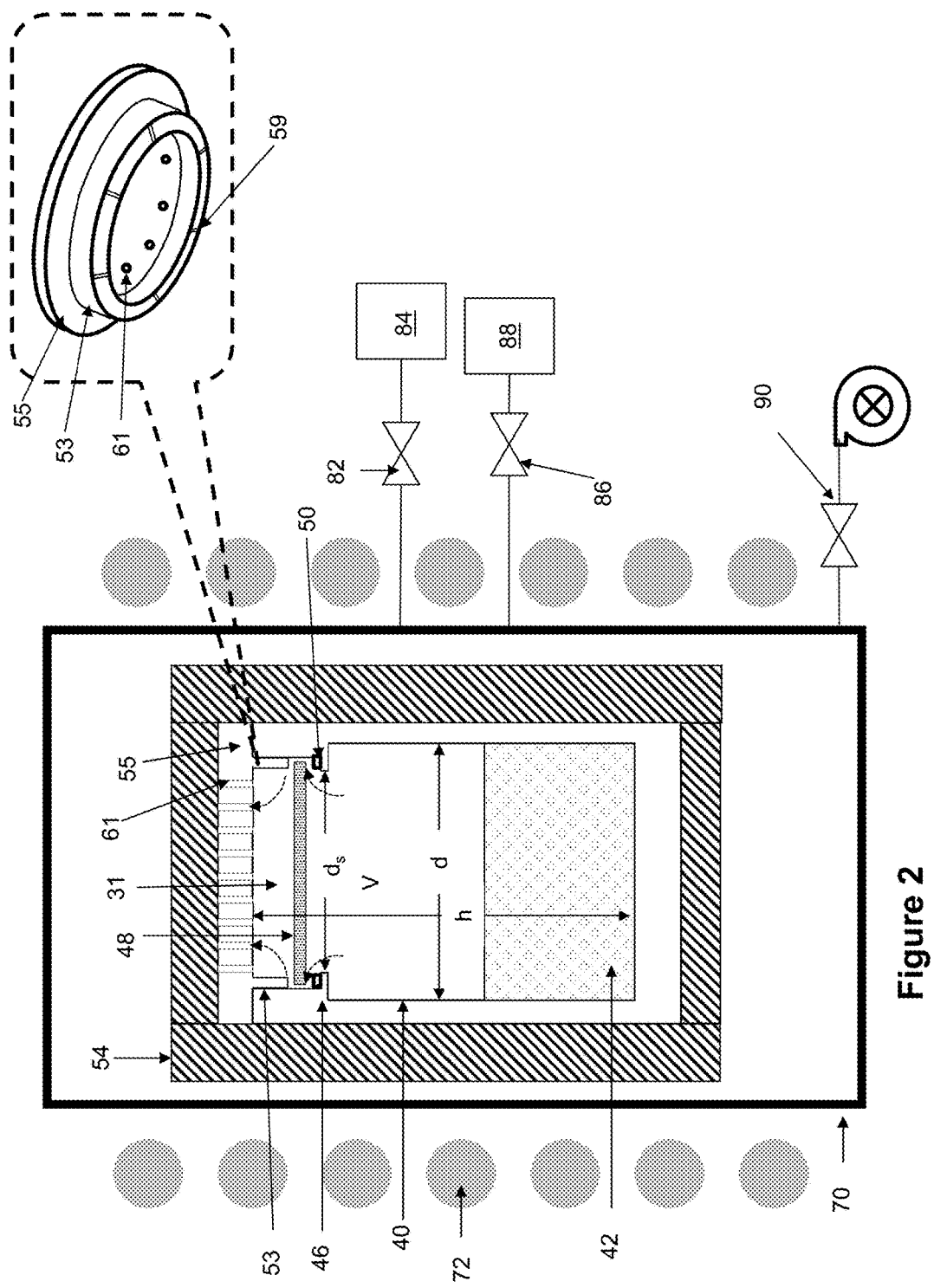
FIG. 2 illustrates a reaction cell for use in embodiments of the invention.

Referring now to FIG. 2, a PVT reaction cell according to one embodiment of this invention is illustrated, which is configured for SiC crystal growth. The reaction cell 40 is preferably formed from a graphite vessel, with graphite lid 55. The cell has an interior diameter designated as "d" and a reaction volume designated as V. The reaction volume refers to the volume over which the vapor transports to land on the seed 48 and grow a crystal. A shelf 46 is provided in the upper portion of the cell, and has an inner diameter, designated "ds" in FIG. 2, which is slightly smaller than the diameter of the seed 48. The shelf 46 can be made as a ring of graphite bonded to the sidewall of the vessel. Alternatively, the shelf 46 may be made integrally with the vessel, e.g., the vessel may be formed with the shelf as integrated part of the interior sidewall of the vessel 40. Of course, the walls of the shelf need not be vertical, but instead may be slanted, in which case the diameter "ds" can have a larger value on the source side of the shelf than on the seed side.

Shelf 46 is used for supporting the seed crystal 48 at its peripheral edge, without any physical attachment. Rather, seed 48 is simply placed inside the vessel so as to rest on the shelf 46. The inside diameter of the cell at the top of the shelf is slightly larger than the seed diameter to accommodate in plane (i.e., horizontal) thermal expansion of the seed. A graphite retainer, 53 is then placed above the seed without contacting the seed, so as to maintain free space above the seed, but allow the seed freedom to move vertically within the bounded space. The retainer 53 is configured to prevent the seed from moving vertically to an extent that the back surface of the seed would contact the surface of the lid 55. In some embodiments, the retainer 53 is formed as part of the lid 55. For example, the retainer 53 may be a ring extension machined or made integrally to the lid 55, as illustrated in the callout.

Figure 1:
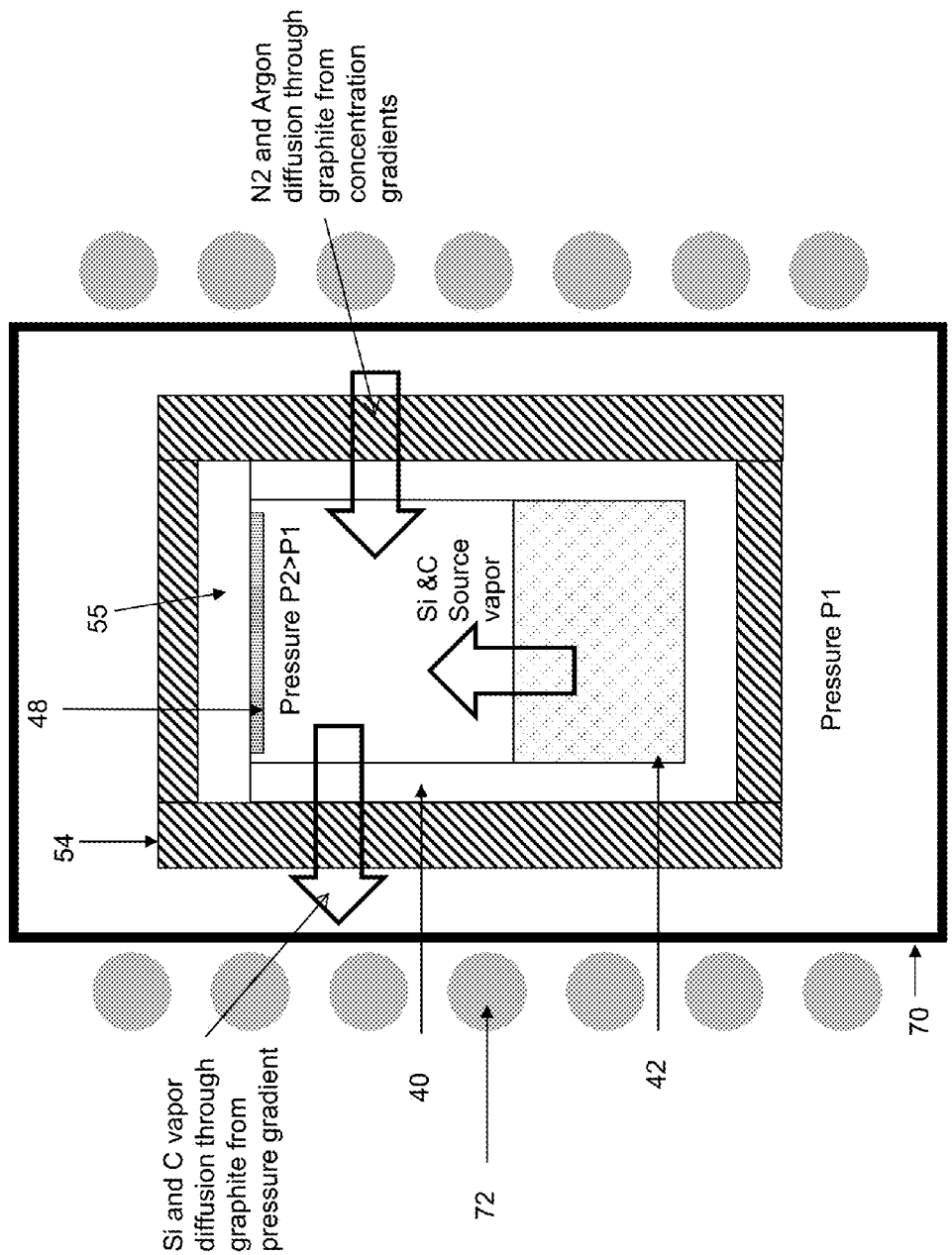
FIG. 1 illustrates a reaction cell according to the prior art.

Optionally, gas channels, 59, are provided at the bottom of the graphite retainer or spacer 53. Example of gas channels is shown in the callout, illustrating grooves 59 that are provided on the surface facing the seed and which assist in gas flow. Alternatively, separate gas channel rings may be provided above the seed, below the seed, or both. In FIG. 1, gas channel ring 50 is provided below the seed 48, and is used to direct the gas into the gap 31 between the lid 55 and the seed 48. Gas channel ring 50 is generally in the shape of a flat washer, having flow channels, like channel 59, at its side facing the seed 48, i.e., in the case shown in FIG. 1 the channels are provided on the top surface of the ring 50. According to one variant of the ring 50, the channels or grooves 59 are provided on the surface facing the seed and on the outer edge of the ring 50.

In the example of FIG. 2, the gas exits the cell 40 through the gas collector 61 in lid 55; however, the gas collector can be any geometry or material that increases the conductance of the gas in the direction out of the top of the cell relative to the radial direction. Generally, the arrangement is configured so as to generate gas flow from below the seed 48, around the seed edge and through the gas channel ring 50 into gap 31, and out of the top of the vessel, as shown by the broken-line arrows in FIG. 1. Both the gas channel fitting and the gas collector should be constructed of a material compatible with the process temperature and chemistry used in SiC crystal growth, e.g., graphite, molybdenum, etc. This overall arrangement allows the seed to be bound in its vertical motion so as to maintain gap 31 between the lid and the back surface of the seed. This way the back surface of the seed never contacts the lid and stresses that may be cause due to such contact are avoided. Also, the arrangement allows the seed to be free to expand and contract without imparting stress to the seed from the cell upon heating and cooling.

As shown in the callout, in this specific example the lid 55 is formed integrally with an extension 53, which functions as a retainer ring 53. Gas flow channels 59 are formed at the bottom of the extension 53, to allow gas flow. When the lid 55 is placed on top of the vessel, it forms gap 31 between the lid 55 and the seed 48. The bottom gas flow ring 50 allows gas to enter from below the seed. Also, there's setback space for the seed 48 to move vertically, i.e., float or be elevated by gas flow upwards, but its vertical movement is bounded to a predefined distance amount by the extension 53, such that its back surface never touches the surface of the lid. Also, holes 61 are provided in the lid 55 to enable pumping of gas out of the vessel through the lid 55.

The reaction cell 40 is configured according to the size of the crystal to be grown therein. The reaction cell is designed to have enough volume V to accommodate the volume of the grown crystal as well as that of the source material needed to grow the crystal. The source material may include polysilicon chips. According to examples detailed further below, it has been determined that to obtain high quality crystals the inner volume of the reaction cell should be in the range of from six to twelve times the expected volume of the final crystal. That is, the diameter d and the volume V is configured such that the resulting volume would be six to twelve times that of the volume of the crystal grown within the reaction cell. More specifically, the reaction cell should have an inner height to inner diameter ratio (h/d) in the range of from 0.8 to 4.0. In other embodiments the internal volume of the reaction cell is set to from 8000 to 20000 $cm^3$, and in some embodiments the ratio of the inner diameter to the inner height of the reaction cell is set to from 2 to 8.

The adoption of 4H—SiC for power device fabrication requires that in many cases the SiC substrates would be used side by side with silicon substrates in process equipment used to fabricate devices. Therefore to insure compatibility the SiC substrates should not result in any cross-contamination of the equipment in the process and the dimensions of the substrates should be compatible with the equipment currently using silicon wafers.

Prior strategies to produce wafers of SiC suitable for CVD epitaxy and device fabrication have been disclosed previously (Loboda, et. al, Ser. No. 13/959,896). The following are steps are followed in certain embodiments disclosed herein, wherein these steps were specifically developed so as to produce SiC substrates that are compatible with manufacturing in a silicon device factory, as described above. The SiC crystal is first sliced using a multiwire slicing process to form slices of average thickness in range 600 to 750 um. A bevel is applied to the substrate using a diamond-coated grooved wheel which creates a bevel angle between 1 and 25 degrees relative to the wafer surface. Typical bevel angle used for silicon wafers is about 22.5 degrees, and this value is applied to SiC wafers in this embodiment as well. The substrate thickness is reduced to a value in the range 365-675 um using diamond abrasives via combinations of fixed abrasive grinding and single/double side loose abrasive polishing to produce a double side polished substrate. In order to produce substrates that are suitably flat for photolithography processes, polished equipment with large polishing tables are used to polish wafers in batches. The table on the polisher is typically at least the equivalent of 40 inches in diameter and capable of polishing batches of substrates with diameter as large as 200 mm. In these embodiments, polishing is performed using cloth pads on both plates and diamond based slurry. The target values for SiC substrate thickness are deliberately smaller than the typical silicon wafer (Si substrate average thickness is larger than 625 um) used to make power devices. This is to insure that the resistance contribution of the SiC substrate is not limiting to the operation of the power device. The final polishing of the substrate is done with silica or alumina abrasives, cloth pads and temperature in the range of 30-60 C in a method which creates both mechanical and chemical action on the substrate. The goal is to reduce the surface roughness to less than 1 nm in order that the wafer is suitable for the CVD epitaxy processes required to make semiconductor devices. In some embodiments the final polish is performed only on the side of the wafer which is intended for growth of the epitaxial film.

It is possible that the process of grinding and polishing the SiC wafer can add metallic contamination and/or particulates to the surface. Particulates will result in defects in epitaxial films deposited on the substrates. Metal contamination is minimized by polishing with cloth polishing pads verses polishers which use soft metal plates such as copper or tin. The substrates are cleaned of particles after diamond polishing using low concentration (0.5-10%) caustic surfactants (9<pH<12) mixed in de-ionized water via an ultrasonic cleaning tank. These steps are followed by rinsing and spin-dry procedures. The substrate is cleaned after the final polish using acidic solutions (pH<4) to remove particles and residual metallic contamination. After final polish both ultrasonic cleaning and polymer brush scrubbing (for example, Polyvinyl alcohol (PVA) brushes) are employed to clean the substrate surface, followed by spin rinsing and drying.

Once the SiC substrate is polished it must be inspected to be sure its surfaces are free of contamination and defects. Using the methods described to make the substrate, inspection of substrates prepared by this method reveals the following The substrate is inspected by laser light scattering spectrometry, a non-destructive test for particles, scratches and other surface imperfections. For the SiC substrate describe above, this test shows aggregated length of scratches less than or equal to 5000 um, and total counts of particles less than or equal to 500 for particle diameters greater than 0.5 um. The same test can be used to count micropipes on the surface of the substrate. By counting the micropipes and dividing the count by the inspection area it is found that the areal density of micropipes is less than or equal to $0.1/cm^2$.

The surfaces of the SiC substrate are inspected by TXRF and the total metal concentration on the surface is characterized by the sum of areal density of atoms Na, Mg, Al, Ca, K, Mg being less than or equal to $275E10/cm^2$ and the sum of areal density of atoms P, Ni, Fe, Co, Cu, Mn being less than or equal to $300E10/cm^2$.

Wafer shape was evaluated to show TTV less than 5 um and warp less than 40 um.

The low level of contaminants, scratches and particles that have been measured on polished SiC substrates fabricated using the methods described show that the values compare favorably with that measured on the silicon substrates which are used to make power devices. This quality enables exchanges between SiC and Si substrates in the same manufacturing line while minimizing risk for production losses. The preferred aggregated scratch length is in the range of from 5um to 5000 um, although an aggregated scratch length in the range from 5um to 10000 um is also workable. The particle count should be maintained at from 5 to 500 total particles with diameter range from 0.5 um to 10 um, for tighter process requirements a particle count of 5-250 total particles with diameter range from 0.5 um to 10 um should be observed, while for somewhat relaxed requirement, a particle count of 5-1000 total particles with diameter range from 0.5 um to 10 um should be observed. Additionally, a total thickness variation (TTV) is set in the range from 0.5 um to 5 um, and warp is set in the range from 1 um to 40 um. In certain embodiments, the warp is limited to 12-30 um, to ensure flatter wafer and higher device yield.

To confirm that the crystal perfection is consistent with fabrication of reliable power devices, a limited sampling of fabricated SiC substrates is destructively tested by molten salt (KOH) etching. Typically, one slice per grown crystal is tested. The molten salt etch process will decorate threading screw dislocations, basal plane dislocations and micropipes. The dislocations were counted at 19 points on the substrate (1 $mm^2$ inspection area per point). The median areal density value of screw dislocations was equal to or less than $400/cm^2$ and the median areal density of basal plane dislocations was less than $2600/cm^2$. In certain embodiments, the basal plane dislocation range is set from 1 to $800/cm^2$, and, for even tighter specification the basal plane dislocation range is set from 1 to $250/cm^2$.

Once the SiC substrate is confirmed to be free of contamination and compatible with substrate use in the fabrication process, films of crystalline SiC must be deposited on the large diameter SiC substrate by a CVD epitaxy process. This is performed in a chemical vapor deposition system capable of batch processing many substrates. Typically the silicon face of the wafer is the deposition surface, but some emerging device designs grow SiC epitaxy on the carbon face. Prior to the deposition of the epitaxial films, the substrates are heated to a temperature in the range of 1400-1600 C and then exposed to a gas that will etch the surface of the substrate. A mixture of hydrogen and hydrogen chloride is an effective gas for etching and offers the added benefit that it will remove metallic and group VI-A contamination from the exposed surface. In some embodiments, one or more of the chemical gases used in the SiC epitaxy contain chlorine. It is discovered that when chlorine species are used in the growth reaction there is an added benefit in that metallic contamination level on the top surface of the grown film will be as low as or lower than that of the surface of the polished substrate prior to commencing the growth. Therefore, in the disclosed embodiments the level of contamination on the wafer surface is strictly controlled prior to commencing the growth process. Additionally, according to embodiments of the invention a flow of chlorine gas in the deposition chamber is used to remove metal contaminants from the surface of the SiC wafers, prior or during the deposition process. It is discovered that by use of flowing chlorine gas, any resulting metallic contamination in the deposited epitaxial layer is lower than the metallic contamination in the SiC wafer.

Once the epitaxy process has been completed the wafers are cleaned to remove loose particles by using ultrasonic bath followed by rinse and spin-dry. In some applications where the epitaxial film deposited is thick (10-100+ um) the back side of the wafer may become rougher. To return the backside of the wafer to its pre-epitaxy condition, polishing of the substrate is done with silica or alumina abrasives, cloth pads and temperature in the range of 30-60° C. in a method which creates both mechanical and chemical action on the substrate. The substrate is cleaned after this polish using acidic solutions (pH<4) to remove particles and residual metallic contamination. This cleaning may be performed using either or both ultrasonic cleaning and polymer brush scrubbing (for example, PVA brushes), followed by spin rinsing and drying procedures.

When designing an epitaxial film structure to build a transistor or diode, typically a minimum of two films is deposited, with the first having a dopant type, concentration and resistivity similar to the substrate and the second layer film having the same type dopant but at a lower concentration which results in higher resistivity than the substrate. Additional films doped with donor or acceptor atoms may also be added. In one example, to fabricate a MOSFET, two layers are required, the first having a resistivity similar to the substrate and the second layer film having much higher resistivity than the substrate.

When the epitaxy process is completed the substrate is cleaned to remove particles that may have been transferred to the substrate during epitaxy growth or handling. The epitaxy process is very clean and does not contribute additional metallic contamination to the surface of the substrates. Testing methods similar to polished wafers is performed on a sampling basis to confirm that the concentrations of metal contaminants, scratches, particles are equal to or less than what is required and achieved on the polished substrate.

To confirm that the crystal perfection of the epitaxial film layer is consistent with fabrication of reliable power devices, a limited sampling of fabricated SiC wafers is destructively tested by molten salt (KOH) etching. The molten salt etch process will decorate threading screw dislocations, basal plane dislocations and micropipes. The dislocations were counted at 19 points on the substrate (1 mm2 inspection area per point). The median areal density value of screw dislocations was equal to or less than 300/cm². In some embodiments, the median areal density of screw dislocations is in the range of from 0/cm² to 400/cm², and in other embodiments the median areal density of screw dislocations is in the range of from 1/cm² to 200/cm². At any of the 19 sites on a wafer the median areal density of basal plane dislocations was less than or equal to 1/cm².

With the advent of a SiC substrate which can be used to fabricate power devices in a manufacturing line which uses silicon substrates, the next step is to extend the diameter of SiC substrates beyond 149 mm to values of larger than 200 mm in order to improve the manufacturing economics of the device fabrication process. The methods to fabricate SiC crystals and substrates described are extendable to substrates with diameter as large as 202 mm.

Example 1

Crystals were grown in reaction cells similar to that illustrated in FIG. 2 and having interior volume six to twelve times that of the volume of the crystal grown within the reaction cell. In this respect, it is noted that in some embodiments the sublimation crystal growth process is stopped when the volume of the crystal reaches one twelfths to one sixth of the internal volume of the reaction cell. In other embodiments the sublimation crystal growth process is stopped when the volume of the crystal reaches one third of the internal volume of the reaction cell.

The crystals were sliced to produce 4H—SiC substrates, such that the resulting surface is at an angle of 4 degrees away from the c-axis toward the <11-20> direction. The edges of the substrates were chamfered to an angle of 22.5+/−0.1 degrees using a grooved diamond grinding wheel. The wafer diameter was within a specification of 150+/−0.4 mm following the edge chamfer process. The wafers were then processed on both sides by surface grinding and polishing, achieving a RMS surface roughness <1 nm. The table below represents total x-ray fluorescence (TXRF) measurements of metal contamination on several 150 mm diameter substrates with examples for tests performed on the silicon face or carbon face. The TXRF measurements were made at three locations on the wafer (radius=0, radius=3.75 mm at 120 degrees, radius=3.75 mm at 300 degrees) on the silicon face (0001). The minimum detectable concentration in a measurement for each element is shown below:

| Silicon Face Metal Contaminants | | | | | | |
|---|---|---|---|---|---|---|
| Wafer | Site | Na | Mg | Al | K | Ca |
| 6B14050011-09 | 1 | <50 | <40 | <30 | <3.9 | 3.11 |
| 6B14050011-09 | 2 | <50 | <40 | <30 | <3.9 | 3.4 |
| 6B14050011-09 | 3 | <50 | <40 | <30 | <3.9 | 2.47 |
| 6B14050011-10 | 1 | <50 | <40 | <30 | <3.9 | 3.18 |
| 6B14050011-10 | 2 | <50 | <40 | <30 | <3.9 | 4.2 |
| 6B14050011-10 | 3 | <50 | <40 | <30 | <3.9 | 3.42 |
| 6B13500011-19 | 1 | <50 | <40 | <30 | <3.9 | 3.56 |
| 6B13500011-19 | 2 | <50 | <40 | <30 | <3.9 | 3.51 |
| 6B13500011-19 | 3 | <50 | <40 | <30 | <3.9 | 2.51 |
| 6B14060010-03 | 1 | <50 | <40 | 57 | <3.9 | 9.11 |
| 6B14060010-03 | 2 | <50 | <40 | 46 | <3.9 | 11.65 |
| 6B14060010-03 | 3 | <50 | <40 | 47 | <3.9 | 9.94 |
| 6B14060010-04 | 1 | <50 | <40 | 84 | <3.9 | 10.8 |
| 6B14060010-04 | 2 | <50 | <40 | 100 | <3.9 | 16 |
| 6B14060010-04 | 3 | <50 | <40 | 56 | <3.9 | 9.2 |
| 6B14100009-11 | 1 | <50 | <40 | 68 | <3.9 | 10.7 |
| 6B14100009-11 | 2 | <50 | <40 | 94 | <3.9 | 11.8 |
| 6B14100009-11 | 3 | <50 | <40 | 65 | <3.9 | 12.5 |

| Wafer | Site | P | Mn | Fe | Co | Ni | Cu |
|---|---|---|---|---|---|---|---|
| 6B14050011-09 | 1 | <53 | <0.27 | 0.36 | <0.18 | <0.18 | <0.35 |
| 6B14050011-09 | 2 | <53 | <0.27 | 0.35 | <0.18 | <0.18 | <0.35 |
| 6B14050011-09 | 3 | <53 | <0.27 | <0.18 | <0.18 | <0.18 | <0.35 |
| 6B14050011-10 | 1 | <53 | <0.27 | <0.18 | <0.18 | <0.18 | <0.35 |
| 6B14050011-10 | 2 | <53 | <0.27 | <0.18 | <0.18 | <0.18 | <0.35 |
| 6B14050011-10 | 3 | <53 | <0.27 | 0.43 | <0.18 | <0.18 | <0.35 |
| 6B13500011-19 | 1 | <53 | <0.27 | 0.4 | <0.18 | <0.18 | <0.35 |
| 6B13500011-19 | 2 | <53 | <0.27 | 0.27 | <0.18 | <0.18 | <0.35 |
| 6B13500011-19 | 3 | <53 | <0.27 | 0.96 | <0.18 | <0.18 | <0.35 |
| 6B14060010-03 | 1 | <53 | <0.27 | 3.13 | <0.18 | 0.23 | <0.35 |
| 6B14060010-03 | 2 | <53 | 0.43 | 1.29 | <0.18 | <0.18 | <0.35 |
| 6B14060010-03 | 3 | <53 | 0.71 | 4.52 | <0.18 | 0.27 | <0.35 |
| 6B14060010-04 | 1 | <53 | 1.65 | 11.8 | <0.18 | 1.39 | <0.35 |
| 6B14060010-04 | 2 | <53 | <0.27 | 32 | 0.51 | 3.39 | <0.35 |
| 6B14060010-04 | 3 | <53 | <0.27 | 0.76 | <0.18 | <0.18 | <0.35 |
| 6B14100009-11 | 1 | <53 | <0.27 | 0.58 | <0.18 | <0.18 | <0.35 |
| 6B14100009-11 | 2 | <53 | <0.27 | 1.71 | <0.18 | <0.18 | <0.35 |
| 6B14100009-11 | 3 | <53 | <0.27 | 2.51 | <0.18 | <0.18 | <0.35 |

| Group of Elements on Si Face | Min (×E10) | Max (×E10) |
|---|---|---|
| Sum of Na, Mg, Al, Ca, K | 126 | 210 |
| Sum of P, Ni, Fe, Co, Cu, Mn | 54 | 90 |

| Metals | | | | | | | | | | | |
|---|---|---|---|---|---|---|---|---|---|---|---|
| Pt | K | Ca | Mn | Fe | Ni | Cu | Co | P | Al | Na | Mg |
| Non Detect Value | 3.89 | 2.47 | 0.27 | 0.18 | 0.18 | 0.35 | 0.18 | 53 | 40 | 50 | 40 |

Maximum and minimum concentrations of groups of contaminant metals are tabulated below.

| Carbon Face Metal Contaminants | | | | | | | | | | | | |
|---|---|---|---|---|---|---|---|---|---|---|---|---|
| | | Metals | | | | | | | | | | |
| | Pt | K | Ca | Mn | Fe | Ni | Cu | Co | P | Al | Na | Mg |
| Non Detect Value | | 3.89 | 2.47 | 0.27 | 0.18 | 0.18 | 0.35 | 0.18 | 53 | 40 | 50 | 40 |
| 6B14080007-07 | 1 | 3.9 | 2.59 | 0.27 | 0.31 | 0.18 | 0.35 | 0.18 | 53 | 99.1 | 50 | 40 |
| | 2 | 3.9 | 2.97 | 0.27 | 0.42 | 0.18 | 0.35 | 0.18 | 53 | 66.27 | 50 | 40 |
| | 3 | 3.9 | 3.98 | 0.53 | 12.17 | 0.75 | 0.35 | 0.18 | 53 | 40 | 50 | 40 |
| 6B141000013-09 | 1 | 3.9 | 2.47 | 0.27 | 1.29 | 1.06 | 0.35 | 0.18 | 53 | 46.95 | 50 | 40 |
| | 2 | 3.9 | 3.79 | 0.27 | 0.73 | 0.18 | 0.35 | 0.18 | 53 | 40 | 50 | 40 |
| | 3 | 3.9 | 3.16 | 0.27 | 0.32 | 0.18 | 0.35 | 0.18 | 53 | 40 | 50 | 40 |
| 6B14110012-14 | 1 | 3.9 | 2.56 | 0.27 | 0.41 | 0.18 | 0.35 | 0.18 | 53 | 44.34 | 50 | 40 |
| | 2 | 3.9 | 5.89 | 0.27 | 1.15 | 0.18 | 0.35 | 0.18 | 53 | 43.61 | 50 | 40 |
| | 3 | 3.9 | 3.58 | 0.27 | 0.58 | 0.18 | 0.35 | 0.18 | 53 | 40 | 50 | 40 |
| max | | 3.9 | 5.89 | 0.53 | 12.17 | 1.06 | 0.35 | 0.18 | 99.1 | 99.1 | 50 | 40 |
| min | | 3.9 | 2.47 | 0.27 | 0.31 | 0.18 | 0.35 | 0.18 | 53 | 40 | 50 | 40 |

| Group of Elements on C Face | Min (×E10) | Max (×E10) |
|---|---|---|
| Sum of Na, Mg, Al, Ca, K | 136 | 199 |
| Sum of P, Ni, Fe, Co, Cu, Mn | 54 | 113 |

Example 2

Wafer Shape and Resistivity

Crystals were grown in reaction cells similar to that illustrated in FIG. 2 and having interior volume six to twelve times that of the volume of the crystal grown within the reaction cell. The crystals were sliced to produce 4H—SiC substrates, such that the resulting surface is at an angle of 4 degrees away from the c-axis toward the <11-20> direction. The edges of the substrates were chamfered to an angle of 22.5+/−0.1 degree using a grooved diamond grinding wheel. The wafer diameter was within a specification of 150+/−0.4 mm following the edge chamfer process. The wafers were then processed on both sides by surface grinding and polishing, achieving a RMS surface roughness of less than 1 nm. Original crystal size, polished wafer diameter, polished wafer thickness, polished wafer shape metrics and resistivity are tabulated.

| | Wafer ID | |
|---|---|---|
| | CE1410-09 | CO1411-04 |
| Targeted Average Wafer Thickness | 350 um | 500 um |
| Raw Crystal Diameter | 160.0 mm | 161.3 mm |
| Wafer Diameter | 150 mm | 150 mm |
| TTV | 3.15 um | 2.12 um |
| Warp | 17.03 um | 28.44 um |
| Average Resistivity | 0.01842 ohm · cm | 0.02068 ohm · cm |
| Maximum Resistivity | 0.01849 ohm · cm | 0.02087 ohm · cm |
| Minimum Resistivity | 0.01838 ohm · cm | 0.01903 ohm · cm |

Example 3

Crystals were grown in reaction cells similar to that illustrated in FIG. 2 and having interior volume six to twelve times that of the volume of the crystal grown within the reaction cell. The crystals were sliced to produce 4H—SiC substrates, such that the resulting surface is at an angle of 4 degrees away from the c-axis toward the <11-20> direction. The edges of the substrates were chamfered to an angle of 22.5+/−0.1 degree using a grooved diamond grinding wheel. The wafer diameter was within a specification of 150+/−0.4 mm following the edge chamfer process. Scratches and particles on the silicon face were evaluated using a laser light scattering spectrometer with 2 mm edge exclusion. The measured original crystal diameter, the polished wafer thickness, wafer scratches and particles are tabulated below.

| Wafer ID | CK1406-08 |
|---|---|
| Crystal Diameter | 159 mm |
| Wafer Diameter | 150 mm |
| Target Wafer Thickness | 365 um |
| Total Particles | 346 |
| Total Scratch Length | 282 um |

Example 4

Crystalline Defects

Crystals were grown in reaction cells similar to that illustrated in FIG. 2 and having interior volume six to twelve times that of the volume of the crystal grown within the reaction cell. Four different crystals were sliced to produce 4H—SiC substrates, which were processed into 150 mm diameter polished substrates. Each substrate was then etched in molten KOH to reveal the dislocations. The numbers of screw dislocations (TSD) and basal plane dislocations (BPD) were counted in 1×1 mm sites located at 19 positions evenly distributed on the substrate. The results are tabulated below:

| Sample ID | Location | BPD ($cm^{-2}$) | TSD ($cm^{-2}$) |
|---|---|---|---|
| BL1337-08 | 1 | 51800 | 0 |
| BL1337-08 | 2 | 14600 | 0 |
| BL1337-08 | 3 | 700 | 0 |
| BL1337-08 | 4 | 3100 | 0 |
| BL1337-08 | 5 | 1400 | 0 |
| BL1337-08 | 6 | 1600 | 0 |
| BL1337-08 | 7 | 2600 | 100 |
| BL1337-08 | 8 | 2700 | 200 |
| BL1337-08 | 9 | 700 | 100 |
| BL1337-08 | 10 | 800 | 100 |
| BL1337-08 | 11 | 1600 | 100 |
| BL1337-08 | 12 | 1300 | 0 |
| BL1337-08 | 13 | 200 | 100 |

-continued

| Sample ID | Location | BPD (cm$^{-2}$) | TSD (cm$^{-2}$) |
|---|---|---|---|
| BL1337-08 | 14 | 100 | 400 |
| BL1337-08 | 15 | 100 | 0 |
| BL1337-08 | 16 | 500 | 800 |
| BL1337-08 | 17 | 300 | 200 |
| BL1337-08 | 18 | 1400 | 300 |
| BL1337-08 | 19 | 200 | 300 |
| CB1351-03 | 1 | 15200 | 200 |
| CB1351-03 | 2 | 11600 | 0 |
| CB1351-03 | 3 | 10700 | 0 |
| CB1351-03 | 4 | 8600 | 0 |
| CB1351-03 | 5 | 12600 | 0 |
| CB1351-03 | 6 | 18100 | 0 |
| CB1351-03 | 7 | 3200 | 0 |
| CB1351-03 | 8 | 1900 | 0 |
| CB1351-03 | 9 | 900 | 300 |
| CB1351-03 | 10 | 2000 | 200 |
| CB1351-03 | 11 | 1200 | 0 |
| CB1351-03 | 12 | 1700 | 0 |
| CB1351-03 | 13 | 2400 | 100 |
| CB1351-03 | 14 | 1800 | 200 |
| CB1351-03 | 15 | 1300 | 300 |
| CB1351-03 | 16 | 500 | 400 |
| CB1351-03 | 17 | 100 | 0 |
| CB1351-03 | 18 | 1300 | 0 |
| CB1351-03 | 19 | 500 | 0 |
| 6B14050011-02 | 1 | 29300 | 0 |
| 6B14050011-02 | 2 | 30900 | 0 |
| 6B14050011-02 | 3 | 40900 | 0 |
| 6B14050011-02 | 4 | 12200 | 0 |
| 6B14050011-02 | 5 | 14700 | 0 |
| 6B14050011-02 | 6 | 17800 | 0 |
| 6B14050011-02 | 7 | 2300 | 0 |
| 6B14050011-02 | 8 | 1000 | 0 |
| 6B14050011-02 | 9 | 2600 | 100 |
| 6B14050011-02 | 10 | 3500 | 0 |
| 6B14050011-02 | 11 | 2900 | 0 |
| 6B14050011-02 | 12 | 4200 | 0 |
| 6B14050011-02 | 13 | 1500 | 0 |
| 6B14050011-02 | 14 | 200 | 200 |
| 6B14050011-02 | 15 | 800 | 200 |
| 6B14050011-02 | 16 | 700 | 0 |
| 6B14050011-02 | 17 | 700 | 0 |
| 6B14050011-02 | 18 | 700 | 0 |
| 6B14050011-02 | 19 | 1400 | 0 |
| 6B14060013-02 | 1 | 32800 | 0 |
| 6B14060013-02 | 2 | 78700 | 0 |
| 6B14060013-02 | 3 | 33200 | 0 |
| 6B14060013-02 | 4 | 33500 | 0 |
| 6B14060013-02 | 5 | 33400 | 0 |
| 6B14060013-02 | 6 | 33200 | 0 |
| 6B14060013-02 | 7 | 4100 | 0 |
| 6B14060013-02 | 8 | 3500 | 0 |
| 6B14060013-02 | 9 | 4600 | 0 |
| 6B14060013-02 | 10 | 4300 | 0 |
| 6B14060013-02 | 11 | 5700 | 0 |
| 6B14060013-02 | 12 | 10900 | 0 |
| 6B14060013-02 | 13 | 500 | 0 |
| 6B14060013-02 | 14 | 200 | 0 |
| 6B14060013-02 | 15 | 200 | 0 |
| 6B14060013-02 | 16 | 700 | 0 |
| 6B14060013-02 | 17 | 1400 | 0 |
| 6B14060013-02 | 18 | 800 | 0 |
| 6B14060013-02 | 19 | 800 | 100 |

The statistics are shown below:

| Basal Plane Dislocation Areal Density (cm$^{-2}$) | | | |
|---|---|---|---|
| Sample ID | Mean | Minimum | Median |
| 6B14050011-02 | 8858 | 200 | 2600 |
| 6B14060013-02 | 14868 | 200 | 4300 |
| BL1337-08 | 4511 | 100 | 1300 |
| CB1351-03 | 5032 | 100 | 1900 |

| Screw Dislocation Areal Density (cm$^{-2}$) | | | |
|---|---|---|---|
| Sample ID | Mean | Minimum | Median |
| 6B14050011-02 | 26.3 | 0.0 | 0.0 |
| 6B14060013-02 | 5.26 | 0.0 | 0.00 |
| BL1337-08 | 142.1 | 0.0 | 100.0 |
| CB1351-03 | 89.5 | 0.0 | 0.0 |

Example 5: Epiwafer Crystalline Defects

4H—SiC substrates was cut and processed into 150 mm diameter polished substrate. An epitaxial film with target thickness 15 um and target doping 6E15/cm3 was deposited on the wafer using a batch warm wall CVD system. The epiwafer was etched in molten KOH to reveal the dislocations. The numbers of screw and basal plane dislocations were counted in 1×1 mm sites located at 19 positions evenly distributed on the substrate. The results are tabulated below:

| Sample ID | Location | x | y | BPD (cm$^{-2}$) | TSD (cm$^{-2}$) |
|---|---|---|---|---|---|
| 6B14110012-05 | 1 | −65.0 | 0.0 | 200 | 0 |
| 6B14110012-05 | 2 | −32.5 | 56.3 | 300 | 0 |
| 6B14110012-05 | 3 | 32.5 | 56.3 | 400 | 0 |
| 6B14110012-05 | 4 | 65.0 | 0.0 | 0 | 100 |
| 6B14110012-05 | 5 | 32.5 | −56.3 | 200 | 0 |
| 6B14110012-05 | 6 | −32.5 | −56.3 | 1500 | 0 |
| 6B14110012-05 | 7 | −38.1 | −22.0 | 0 | 300 |
| 6B14110012-05 | 8 | −38.1 | 22.0 | 100 | 700 |
| 6B14110012-05 | 9 | 0.0 | 44.0 | 0 | 400 |
| 6B14110012-05 | 10 | 38.1 | 22.0 | 200 | 200 |
| 6B14110012-05 | 11 | 38.1 | −22.0 | 0 | 0 |
| 6B14110012-05 | 12 | 0.0 | −44.0 | 0 | 300 |
| 6B14110012-05 | 13 | −11.0 | −19.1 | 0 | 400 |
| 6B14110012-05 | 14 | −22.0 | 0.0 | 0 | 500 |
| 6B14110012-05 | 15 | −11.0 | 19.1 | 0 | 400 |
| 6B14110012-05 | 16 | 11.0 | 19.1 | 0 | 400 |
| 6B14110012-05 | 17 | 22.0 | 0.0 | 0 | 400 |
| 6B14110012-05 | 18 | 11.0 | −19.1 | 0 | 800 |
| 6B14110012-05 | 19 | 0.0 | 0.0 | 0 | 500 |
| Median | | | | 0 | 300 |
| Average | | | | 153 | 284 |
| Minimum | | | | 0 | 0 |

Example 6: Epiwafer Metal Contamination

The tables below represent total x-ray fluorescence (TXRF) measurements of metal contamination on several 150 mm diameter substrates with examples for tests performed on the silicon face or carbon face. The TXRF measurements were made at three locations on the wafer (radius=0, radius=3.75 mm at 120 degrees, radius=3.75 mm at 300 degrees). Maximum and minimum concentrations of groups of contaminant metals are tabulated below.

4H—SiC substrates were cut and processed into 150 mm diameter polished substrates. An epitaxial film with target thickness 5 um and target doping 1.5-2.0E15/cm3 was deposited on the wafers using a batch warm wall CVD system. The TXRF measurements were performed on the silicon face.

| Ser. No. | Site | K | Ca | Mn | Fe | Ni | Cu | Co | Al | Na | Mg | P |
|---|---|---|---|---|---|---|---|---|---|---|---|---|
| ND value | | 3.89 | 2.47 | 0.27 | 0.18 | 0.18 | 0.35 | 0.18 | 40 | 50 | 40 | 53 |
| 6B14050014-05 | 1 | 3.89 | 3.02 | 0.27 | 0.32 | 0.18 | 0.35 | 0.18 | 40 | 50 | 40 | 53 |
| 6B14050014-05 | 2 | 3.89 | 4.68 | 0.27 | 1.33 | 0.18 | 0.35 | 0.18 | 40 | 50 | 40 | 53 |
| 6B1405001405- | 3 | 3.89 | 2.47 | 0.27 | 0.27 | 0.18 | 0.35 | 0.18 | 40 | 50 | 40 | 53 |
| 6B14070008-05 | 1 | 3.89 | 3.64 | 0.27 | 0.68 | 0.18 | 0.35 | 0.18 | 40 | 50 | 40 | 53 |
| 6B14070008-05 | 2 | 3.89 | 2.78 | 0.27 | 6.93 | 0.94 | 0.35 | 0.18 | 40 | 50 | 40 | 53 |
| 6B14070008-05 | 3 | 3.89 | 3.85 | 0.27 | 0.9 | 0.18 | 0.35 | 0.18 | 40 | 50 | 40 | 53 |

| Group of Elements on Si Face | Min (×E10) | Max (×E10) |
|---|---|---|
| Sum of Na, Mg, Al, Ca, K | 136.36 | 138.57 |
| Sum of P, Ni, Fe, Co, Cu, Mn | 53.90 | 61.32 |

4H—SiC substrates were cut and processed into 150 mm diameter polished substrates. An epitaxial film with target thickness 15 um and target doping 3.6E15/cm3 was deposited on the wafers using a batch warm wall CVD system. The TXRF measurements were performed on both the silicon and carbon face.

| | | K | Ca | Mn | Fe | Ni | Cu | Co | Al | Na | Mg | P |
|---|---|---|---|---|---|---|---|---|---|---|---|---|
| Non Detect Value | Site | 3.89 | 2.47 | 0.27 | 0.18 | 0.18 | 0.35 | 0.18 | 40.00 | 50.00 | 40.00 | 53.00 |
| 6B14060012-02 Si-Face | 1 | 3.89 | 4.45 | 0.27 | 0.43 | 0.18 | 0.35 | 0.18 | 40.00 | 50.00 | 40.00 | 53.00 |
| | 2 | 3.89 | 5.81 | 0.27 | 1.09 | 0.18 | 0.35 | 0.18 | 40.00 | 50.00 | 40.00 | 53.00 |
| | 3 | 3.89 | 3.67 | 0.27 | 0.50 | 0.18 | 0.35 | 0.18 | 40.00 | 50.00 | 40.00 | 53.00 |
| Si Face Only | min | 3.89 | 3.67 | 0.27 | 0.43 | 0.18 | 0.35 | 0.18 | 40.00 | 50.00 | 40.00 | 53.00 |
| | max | 3.89 | 5.81 | 0.27 | 1.09 | 0.18 | 0.35 | 0.18 | 40.00 | 50.00 | 40.00 | 53.00 |
| 6B14060012-02 C-Face | 1 | 45.50 | 43.24 | 0.27 | 7.00 | 0.92 | 1.31 | 0.18 | 75.26 | 57.68 | 40.00 | 53.00 |
| | 2 | 28.69 | 2.47 | 0.27 | 1.90 | 0.18 | 0.35 | 0.18 | 40.00 | 54.48 | 40.00 | 53.00 |
| | 3 | 24.48 | 2.47 | 0.27 | 0.68 | 0.18 | 0.35 | 0.18 | 40.00 | 50.00 | 40.00 | 53.00 |
| C-face Only | min | 24.48 | 2.47 | 0.27 | 0.68 | 0.18 | 0.35 | 0.18 | 40.00 | 50.00 | 40.00 | 53.00 |
| | max | 45.50 | 43.24 | 0.27 | 7.00 | 0.92 | 1.31 | 0.18 | 75.26 | 57.68 | 40.00 | 53.00 |

| | Min (×E10) | Max (×E10) |
|---|---|---|
| Group of Elements on C Face | | |
| Sum of Na, Mg, Al, Ca, K | 156.95 | 261.68 |
| Sum of P, Ni, Fe, Co, Cu, Mn | 54.66 | 62.68 |
| Group of Elements on Si Face | | |
| Sum of Na, Mg, Al, Ca, K | 137.56 | 139.70 |
| Sum of P, Ni, Fe, Co, Cu, Mn | 54.41 | 55.07 |

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of functional elements will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the relevant arts. It is intended that the specification and examples be considered as exemplary only, with a true scope and spirit of the invention being indicated by the following claims.

The invention claimed is:

1. A method for manufacturing SiC crystal to a grown volume, comprising:
   i. introducing a mixture comprising silicon chips into a reaction cell, the reaction cell being made of graphite and having cylindrical interior of internal volume in the range of from six to twelve times the grown volume of the SiC crystal;
   ii. placing a silicon carbide seed crystal inside the reaction cell adjacent to a lid of the reaction cell;
   iii. sealing the cylindrical reaction cell using the lid;
   iv. surrounding the reaction cell with graphite insulation;
   v. introducing the cylindrical reaction cell into a vacuum furnace;
   vi. evacuating the vacuum furnace;
   vii. filling the vacuum furnace with a gas mixture comprising inert gas;
   viii. heating the cylindrical reaction cell in the vacuum furnace to a temperature in the range from 1975° C. to 2500° C.;
   ix. reducing the pressure in the vacuum furnace to from 0.05 torr to less than 50 torr;
   x. flowing nitrogen gas configured to introduce nitrogen donor concentration larger than $3E18/cm^2$, and up to $6E18/cm^2$; and,
   xi. allowing for sublimation of silicon and carbon species and condensation of vapors on the seed and stopping the sublimation when the grown volume of the SiC crystal reaches one twelfth to one sixth of the internal volume of the reaction cell and the SiC crystal is sufficiently large to yield ten or more substrates.

2. The method of claim 1, wherein the cylindrical graphite reaction cell has a volume of from 4000 $cm^3$ to 16000 $cm^3$.

3. The method of claim 2, wherein the cylindrical graphite reaction cell has a ratio of inner height to inner diameter in the range from 0.8 to 4.0.

4. The method of claim 1, wherein the seed is placed inside the reaction cell without physical attachment to the reaction cell or the lid, thereby enabling the seed to freely expand.

5. The method of claim 1, wherein the seed is placed on a shelf inside the reaction cell.

6. The method of claim 1, further comprising slicing the crystal in a direction such that resulting wafers have surface that is tilted from 3.5 to 4.4 degrees away from c-axis toward <11-20> direction.

7. The method of claim 6, further comprising grinding and polishing each wafer to thereby reduce thickness of each wafer to an average thickness in the range of 365 μm to 675 μm.

8. The method of claim 7, further comprising grinding circumferential edge of each wafer to create a beveled edge.

9. The method of claim 8, wherein grinding and polishing each wafer is performed to generate a total thickness variation in the range of from 0.5 μm to 5 μm, and warp in the range of from 1 um to 40 μm.

10. The method of claim 9, further comprising cleaning the wafers to provide surface metal contamination level measured by TXRF on either a C face or an Si face of the substrate as the sum of the areal density of Na, Mg, Al, Ca, K, Mg from $25E10/cm^2$ to $250E10/cm^2$ and the sum of areal density of atoms P, Ni, Fe, Co, Cu, Mn from $10E10/cm^2$ to $150E10/cm^2$ wherein cleaning the wafers comprises dipping the wafers in ultrasonic cleaning tank having caustic surfactants having a pH of from greater than 9 to less than 12, and mixed in de-ionized water.

11. The method of claim 1, wherein stopping the sublimation is done when the grown volume of the SiC crystal reaches one third of the internal volume of the reaction cell.

12. The method of claim 10, wherein the concentration of the caustic surfactant is from 0.5 to 10%.

13. The method of claim 12, further comprising performing rinsing and spin-dry procedures.

14. The method of claim 13, further comprising cleaning the substrates after polishing using acidic solution having pH of less than 4, so as to remove particles and residual metallic contamination.

15. The method of claim 14, further comprising scrubbing the wafers using polyvinyl alcohol brush.

16. The method of claim 15, wherein median areal density of crystalline dislocations in the substrate is between $1/cm^2$ and $2600/cm^2$.

17. The method of claim 16, wherein aggregated scratch length measured on fabrication surface of each wafer is in a range from 5 μm to 5000 μm.

18. The method of claim 17, wherein a particle count in each wafer is from 5 to 500 total particles each having a diameter range from 0.5 μm to 10 μm.

19. The method of claim 18, further comprising loading the substrates into epitaxial deposition chamber and depositing epitaxial layer of SiC on the wafers.

20. The method of claim 19, wherein after loading the substrate but prior to depositing epitaxial layers, cleaning the substrates by heating the substrates to an elevated temperature and flowing a gas mixture of hydrogen and hydrogen chloride into the epitaxial deposition chamber.

21. The method of claim 20, wherein the epitaxial layers are deposited on the substrates using a gas mixture which included at least one gas with a chlorine atom.

22. The method of claim 19, wherein prior to loading the substrates, the surface metal contamination level of each substrate, is measured by TXRF on either a C face or an Si face of the substrate, and the sum of the areal density of Na, Mg, Al, Ca, K, Mg is from $25E10/cm^2$ to $250E10/cm^2$ and a sum of areal density of atoms P, Ni, Fe, Co, Cu, Mn is from $10E10/cm^2$ to $150E10/cm^2$.

23. The substrate of claim 22, wherein when the SiC homoepitaxial layer is etched in molten KOH and measured at 19 sites distributed across a surface, the median areal density of screw dislocations is in the range of from $0/cm^2$ to $400/cm^2$, and at least one site measured zero screw dislocations, and median areal density of basal plane dislocations is in the range of from $0/cm^2$ to $20/cm^2$, and at least one site measured zero basal plane dislocations.

24. The method of claim 4, wherein a setback space is provided between the seed and the lid, enabling the seed to freely move vertically, wherein the seeds' vertical movement is bounded to a predefined distance amount such that back surface of the seed never touches the surface of the lid.

* * * * *